US007092290B2

(12) United States Patent
Hemink

(10) Patent No.: US 7,092,290 B2
(45) Date of Patent: Aug. 15, 2006

(54) HIGH SPEED PROGRAMMING SYSTEM WITH REDUCED OVER PROGRAMMING

(75) Inventor: Gerrit Jan Hemink, Yokohama (JP)

(73) Assignee: Sandisk Corporation, Sunnyvale, CA (US)

( * ) Notice: Subject to any disclaimer, the term of this patent is extended or adjusted under 35 U.S.C. 154(b) by 0 days.

(21) Appl. No.: 10/990,702

(22) Filed: Nov. 16, 2004

(65) Prior Publication Data

US 2006/0104120 A1    May 18, 2006

(51) Int. Cl.
*G11C 16/04*    (2006.01)
(52) U.S. Cl. .......................... 365/185.18; 365/185.17; 365/185.22
(58) Field of Classification Search ........... 365/185.02, 365/185.17, 185.18, 185.19, 185.22, 185.23, 365/185.28
See application file for complete search history.

(56) References Cited

U.S. PATENT DOCUMENTS

| 5,220,531 | A | 6/1993 | Blyth et al. |
| 5,313,421 | A | 5/1994 | Guterman et al. |
| 5,386,422 | A | 1/1995 | Endoh et al. |
| 5,412,601 | A | 5/1995 | Sawada et al. |
| 5,521,865 | A | 5/1996 | Ohuchi et al. |
| 5,570,315 | A | 10/1996 | Tanaka et al. |
| 5,652,719 | A | 7/1997 | Tanaka et al. |
| 5,712,180 | A | 1/1998 | Guterman et al. |
| 5,712,815 | A | 1/1998 | Bill et al. |
| 5,761,222 | A | 6/1998 | Baldi |
| 5,870,344 | A | 2/1999 | Ozawa |
| 5,949,714 | A | 9/1999 | Hemink et al. |
| 6,151,248 | A | 11/2000 | Harari et al. |
| 6,222,762 | B1 | 4/2001 | Guterman et al. |
| 6,266,270 | B1 | 7/2001 | Nobukata |
| 6,278,632 | B1 | 8/2001 | Chevallier |
| 6,301,161 | B1 | 10/2001 | Holzmann et al. |
| 6,317,364 | B1 | 11/2001 | Guterman et al. |
| 6,373,748 | B1* | 4/2002 | Ikehashi et al. ........ 365/185.22 |
| 6,424,566 | B1 | 7/2002 | Parker |

(Continued)

FOREIGN PATENT DOCUMENTS

WO    WO 98/28745    7/1998

OTHER PUBLICATIONS

Kurata, Hideaki, et al., Constant-Charge-Injection Programming for 10-MB/s Multilevel AG-AND Flash Memories, 2002 Symposium On VLSI Circuits Digest of Technical Papers, pp. 302-303.
Johnson, William S., et al., Session XII: ROMs, PROMs and EROMs, 1980 IEEE International Solid State Circuits Conference, pp. 152-153.

(Continued)

*Primary Examiner*—Gene N. Auduong
(74) *Attorney, Agent, or Firm*—Vierra Magen Marcus & DeNiro LLP

(57) ABSTRACT

A program pulse is applied to a set of non-volatile storage elements. The magnitude of the program pulse is chosen to be low enough such that no non-volatile storage elements will be over programmed. The non-volatile storage elements are tested to determine whether at least one non-volatile storage element (or some other minimum number) has been programmed past a test threshold. If so, the set of non-volatile memory elements is considered to have one or more fast programming non-volatile storage elements and future programming is performed using a smaller increment value for subsequent program pulses. If the set of non-volatile memory elements is not determined to have one or more fast programming non-volatile storage elements, then a larger increment value is used for subsequent program pulses until one non-volatile storage element (or some other minimum number) has been programmed past the test threshold, at which point the smaller increment value is used for subsequent program pulses.

44 Claims, 12 Drawing Sheets

U.S. PATENT DOCUMENTS

| | | |
|---|---|---|
| 6,522,580 B1 | 2/2003 | Chen et al. |
| 6,525,964 B1 | 2/2003 | Tanaka et al. |
| 6,529,412 B1 | 3/2003 | Chen et al. |
| 6,532,172 B1 | 3/2003 | Harari et al. |
| 6,535,428 B1 * | 3/2003 | Pasotti et al. .......... 365/185.21 |
| 6,643,188 B1 | 11/2003 | Tanaka et al. |
| 6,738,289 B1 | 5/2004 | Gongwer et al. |
| 2002/0118574 A1 | 8/2002 | Gongwer et al. |
| 2003/0147278 A1 | 8/2003 | Tanaka et al. |

OTHER PUBLICATIONS

Nobukata, Hiromi, et al., A 144Mb 8-Level NAND Flash Memory with Optimized Pulse Width Programming, 1999 Symposium on VLSI Circuits Digest of Technical Papers, pp. 39-40.

Ohkawa, Masayoshi, et al., TP 2.3: A 98 mm2 3.3V 64 Mb Flash Memory with FN-NOR Type 4-level Cell, 1996 IEEE International Solid-State Circuits Conference, pp. 36-37.

* cited by examiner

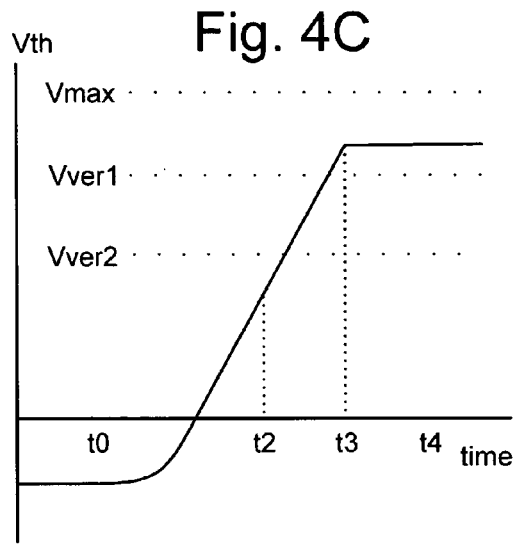
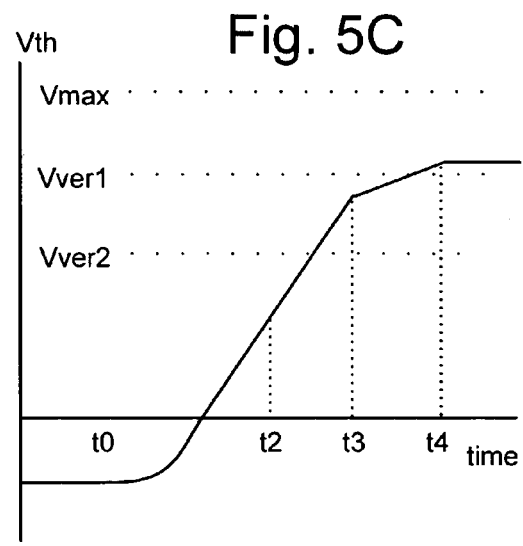
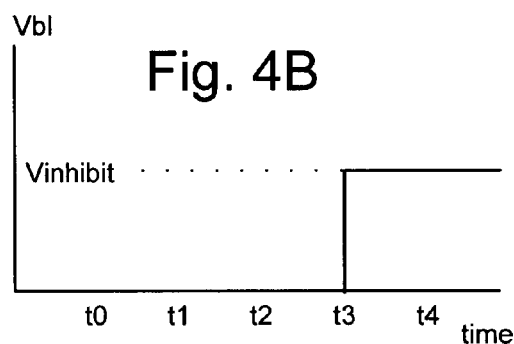
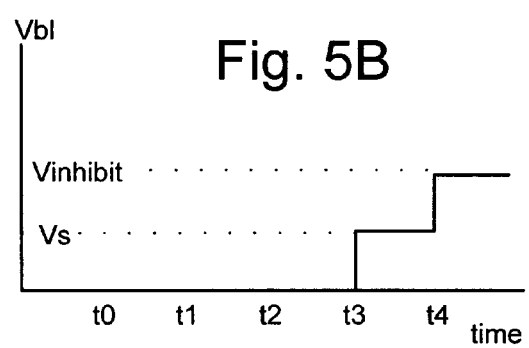
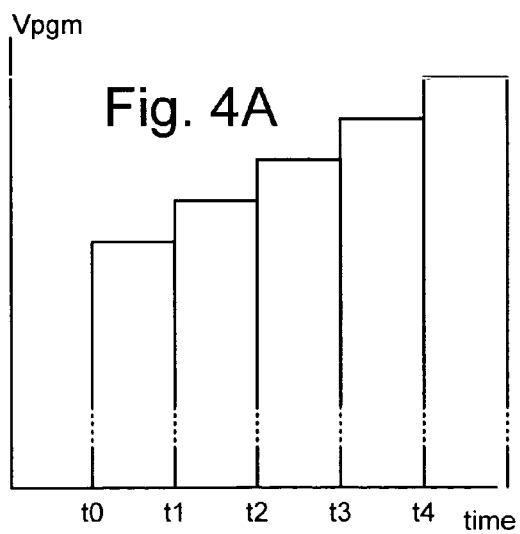
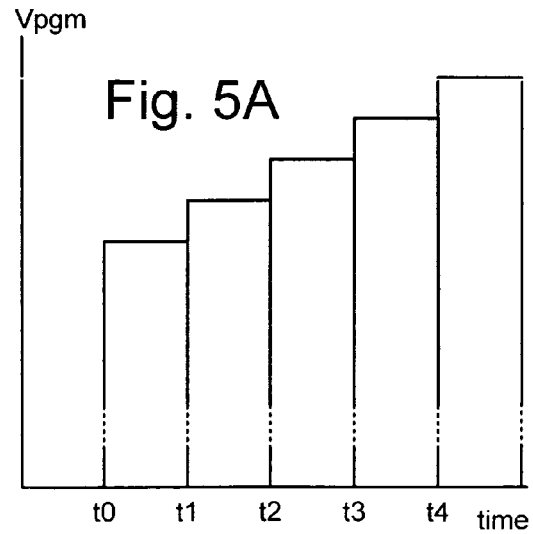

US 7,092,290 B2

HIGH SPEED PROGRAMMING SYSTEM WITH REDUCED OVER PROGRAMMING

BACKGROUND OF THE INVENTION

1. Field of the Invention

The present invention relates to programming non-volatile memory.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. patent application Ser. No. 10/379,608, titled "Self Boosting Technique," filed on Mar. 5, 2003; and in U.S. patent application Ser. No. 10/629,068, titled "Detecting Over Programmed Memory," filed on Jul. 29, 2003, both applications are incorporated herein by reference in their entirety.

Some EEPROM and flash memory devices have a floating gate that is used to store two ranges of charges and, therefore, the memory cell can be programmed/erased between two states (an erased state and a programmed state). For example, FIG. 1 shows a graph depicting two threshold voltage distributions. The x axis plots threshold voltage and the y axis plots the number of memory cells. Threshold voltage distribution 2 is less than zero volts. In one embodiment, threshold voltage distribution 2 corresponds to erased memory cells that store data "1." Threshold voltage distribution 4 is greater than zero volts. In one embodiment, threshold voltage distribution 4 corresponds to programmed memory cells that store data "0."

A multi-state flash memory cell is implemented by identifying multiple, distinct allowed threshold voltage ranges separated by forbidden voltage ranges. Each distinct threshold voltage range corresponds to a predetermined value for the set of data bits. FIG. 2 illustrates threshold voltage distributions for memory cells storing two bits of data (e.g., four data states). In one embodiment, threshold voltage distribution 2 represents memory cells that are in the erased state (e.g., storing "11"), having negative threshold voltage levels. Threshold voltage distribution 10 represents memory cells that store data "10," having positive threshold voltage levels. Threshold voltage distribution 12 represents memory cells storing data "00." Threshold voltage distribution 14 represents memory cells that are storing "01." In other embodiments, each of the distributions can correspond to different data states than described above. In some implementations (as exemplified above), these data values (e.g. logical states) are assigned to the threshold ranges using a gray code assignment so that if the threshold voltage of a floating gate erroneously shifts to its neighboring physical state, only one logical bit will be affected. The specific relationship between the data programmed into the memory cell and the threshold voltage ranges of the cell depends upon the data encoding scheme adopted for the memory cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells. Additionally, the present is applicable to memory cells that store more than two bits of data.

Threshold voltage distributions 2 and 4 show the erased and programmed voltage-distributions when no verify operations are used. These distributions can be obtained by programming or erasing the memory cells with one single programming or erase pulse. Depending on the memory array size and the variations in the production process, the threshold voltage distribution 4 has a certain width, known as the natural Vt width.

As can be seen from FIG. 2, distributions 10, 12, and 14 (corresponding to programming a multi-state device) need to be much narrower than the natural Vt width of distribution 4. To achieve such narrower threshold voltage distributions a process that uses multiple programming pulses and verify operations, such as that described by FIGS. 3A, 3B, and 3C, can be used.

FIG. 3A depicts a programming voltage signal Vpgm that is applied to the control gate as a series of pulses. The magnitude of the pulses is increased with each successive pulse by a pre-determined step size (e.g., 0.2 v–0.4 v), depicted in FIG. 3A as ΔVpgm. In the periods between the pulses, verify operations are carried out. As the number of programmable states increase, the number of verify operations increases and more time is needed. One means for reducing the time-burden is a more efficient verified process, such as the process that is disclosed in U.S. patent application Ser. No. 10/314,055 "Smart Verify For Multi-State Memories," filed Dec. 5, 2002, incorporated herein by reference in its entirety. In reality, the pulses of FIG. 3A are separated from each other by a time period for verification. However, to make FIG. 3 more readable, the time period for verification is omitted from the drawing.

FIG. 3B depicts the voltage signal applied to a bit line for the associated memory cell being programmed. FIG. 3C depicts the threshold voltage of the memory cell being programmed. Note that the graph in FIG. 3C is smoothed out to make it easier to read. After each programming pulse, a verify operation is carried out (not shown.) During the verify operation, the threshold voltage of the memory cell to be programmed is checked. If the memory cell of the threshold voltage is larger than the target value (e.g., Vverify), then programming for that memory cell is inhibited in the next cycle by raising the bit line voltage from 0 v to Vinhibit (e.g., at time t4).

As with other electronic devices, there is a consumer demand for memory devices to program as fast as possible. For example, the user of a digital camera that stores images on a flash memory card does not want to wait between pictures for an unnecessary long period of time. In addition to programming with reasonable speed, to achieve proper data storage for a multi-state memory cell, the multiple ranges of threshold voltages of the multi-state memory cells should be separated from each other by sufficient margin so that the level of the memory cell can be programmed and read in an unambiguous manner. Additionally, a tight threshold voltage distribution is recommended. To achieve a tight threshold voltage distribution, small program steps have typically been used, thereby, programming the threshold voltage of the cells more slowly. The tighter the desired threshold voltage distribution the smaller the steps and the slower the programming process.

One solution for achieving tight threshold voltage distributions, without unreasonably slowing down the programming process, includes using a two-phase programming process. The first phase, a coarse programming phase, includes an attempt to raise a threshold voltage in a faster manner and paying less attention to achieving a tight threshold voltage distribution. The second phase, a fine programming phase, attempts to raise the threshold voltage in a slower manner in order to reach the target threshold voltage, while also achieving a tighter threshold voltage distribution. One example of a coarse/fine programming methodology can be found in U.S. Pat. No. 6,643,188, incorporated herein by reference in its entirety.

FIGS. 4 and 5 provide more detail of one example of a coarse/fine programming methodology. FIGS. 4A and 5A depict the programming pulses Vpgm applied to the control gate. FIGS. 4B and 5B depict the bit line voltages for the memory cells being programmed. FIGS. 4C and 5C depict the threshold voltage of the memory cells being programmed. This example of FIGS. 4 and 5 uses two verify levels, indicated in the Figures as Vver1 and Vver2. The final target level is Vver1. When a threshold voltage of the memory cell has reached Vver1, the memory cell will be inhibited from further programming by applying an inhibit voltage to the bit line corresponding to that memory cell. For example, the bit line voltage can be raised to Vinhibit (See FIG. 4B and FIG. 5B). However, when a memory cell has reached a threshold voltage close to (but lower than) the target value Vver1, the threshold voltage shift to the memory cell during subsequent programming pulses is slowed down by applying a certain bias voltage to the bit line, typically in the order of 0.3 v to 0.8 v. Because the rate of threshold voltage shift is reduced during the next few programming pulses, the final threshold voltage distribution can be narrower than with the methods depicted in FIG. 3. To implement this method, a second verify level that is lower than that of Vver1 is used. This second verify level is depicted in FIGS. 4 and 5 as Vver2. When the threshold voltage of the memory cell is larger than Vver2, but still lower than Vver1, the threshold voltage shift to the memory cell will be reduced for subsequent programming pulses by applying a bit line bias Vs (FIG. 5B). Note that in this case, two verify operations are required for each state. One verify operation at the corresponding Vver1 for each state, and one verify operation at the corresponding Vver2 for each state. This may increase the total time needed to program the memory cells. However, a large ΔVpgm step size can be used to speed up the process.

FIGS. 4A, 4B, and 4C show the behavior of a memory cell whose threshold voltage moves past Vver2 and Vver1 in one programming pulse. For example, the threshold voltage is depicted in FIG. 4C to pass Vver2 and Vver1 in between t2 and t3. Thus, prior to t3, the memory cell is in the coarse phase. After t3, the memory cell is in the inhibit mode.

FIGS. 5A, 5B, and 5C depict a memory cell that enters both the coarse and fine programming phases. The threshold voltage of the memory cell crosses Vver2 in between time t2 and time t3. Prior to t3, the memory cell is in the coarse phase. After t3, the bit line voltage is raised to Vs; therefore, the memory cell is in the fine phase. In between t3 and t4, the threshold voltage of the memory cell crosses Vver1; therefore, the memory cell is inhibited from further programming by raising the bit line voltage to Vinhibit.

One problem experienced by non-volatile memory, particularly multi-state memory, is that over-programming can occur. During the programming process, the memory cells are programmed to a certain target state defined by the threshold voltage range for that particular set of data. When a memory cell is programmed to a certain threshold voltage range, the threshold voltage of that cell should not exceed the maximum allowed threshold voltage for that range. For example, looking at FIG. 2, if the memory cell is to be programmed to target state 10, the memory cell's threshold voltage should be raised to be higher than Vv1, however should stay below Vmax 1, the maximum allowable threshold voltage for distribution 10. When the threshold voltage of the memory cell exceeds the allowable range, there may be a failure when reading the data later on. This phenomenon is called over-programming. In some cases, error correction can be used to correct errors caused by over-programming. However, some over-programming cannot be rectified by error correction. Additionally, error correction can be very time consuming.

FIG. 6 depicts erased threshold voltage distribution 2 and programmed threshold voltage distribution 80. Threshold voltage distribution 80 includes a set of one or more memory cells that program faster than normal. These fast memory cells are candidates for being over-programmed. For example, after one program pulse, instead of obtaining threshold voltage distribution 4 of FIG. 1, the population of memory cells that includes one or more fast cells will result in threshold voltage distribution 80 of FIG. 6. Threshold voltage distribution 80 includes fast memory cells 82.

FIGS. 7A, 7B, and 7C further illustrate a problem with fast memory cells that can be over-programmed. FIG. 7A, depicts the threshold voltage distributions 2, 10, 12 and 14 for a two-bit multi-state memory cell. FIG. 7B shows natural erased threshold voltage distribution 2 and programmed threshold voltage distribution 84. In one embodiment, distribution 84 is associated with the population of memory cells intended to be programmed to distribution 10, after one programming pulse. As can be seen, the distribution is moved over towards what should be distribution 10. Distribution 84 includes a set of fast memory cells, some of which exceed the read verify point Vr1. As can be seen from FIG. 7A, the read verify point is the voltage level used to distinguish between threshold voltage distribution 10 and threshold voltage distribution 12. Therefore, after one programming pulse, some of the memory cells in threshold voltage distribution 84 already have an error because they have a threshold voltage distribution greater than Vr1. At the end of the programming process, those memory cells intended to be in threshold voltage distribution 10 will likely be in distribution 86, as depicted in FIG. 7C. The difference between threshold voltage distribution 86 and threshold voltage distribution 10 of FIG. 7A, is that threshold voltage distribution 86 includes a set of fast memory cels (the front-end tail of distribution 86) that have threshold voltage that exceeds Vr1. These fast bits with a threshold voltage greater than Vr1 can return an error when read.

SUMMARY OF THE INVENTION

The technology described herein attempts to avoid or reduce over-programming.

In one embodiment, a program pulse is applied to a set of non-volatile storage elements. The magnitude of the program pulse is chosen to be low enough such that no non-volatile storage elements will be over programmed. The non-volatile storage elements are tested to determine whether at least one non-volatile storage element (or some other minimum number) has been programmed past a test threshold. If so, the set of non-volatile memory elements is considered to have one or more fast programming non-volatile storage elements and future programming is performed using a smaller increment value for subsequent program pulses. If the set of non-volatile memory elements is not determined to have one or more fast programming non-volatile storage elements, then a larger increment value is used for subsequent program pulses until one non-volatile storage element (or some other minimum number) has been programmed past the test threshold, at which point the smaller increment value is used for subsequent program pulses.

These and other objects and advantages of the present invention will appear more clearly from the following description in which the preferred embodiment of the invention has been set forth in conjunction with the drawings.

BRIEF DESCRIPTION OF THE DRAWINGS

FIG. 3A depicts a programming voltage signal that is applied to a control gate of a non-volatile storage element. FIG. 3B depicts a voltage signal applied to a bit line for a NAND string. FIG. 3C depicts the threshold voltage of the non-volatile storage element being programmed.

FIGS. 4A, 4B and 4C depict a one embodiment of a programming process that is performed as part of coarse/fine programming.

FIGS. 5A, 5B and 5C depict a one embodiment of a programming process that is performed as part of coarse/fine programming.

DETAILED DESCRIPTION

Figure 1:
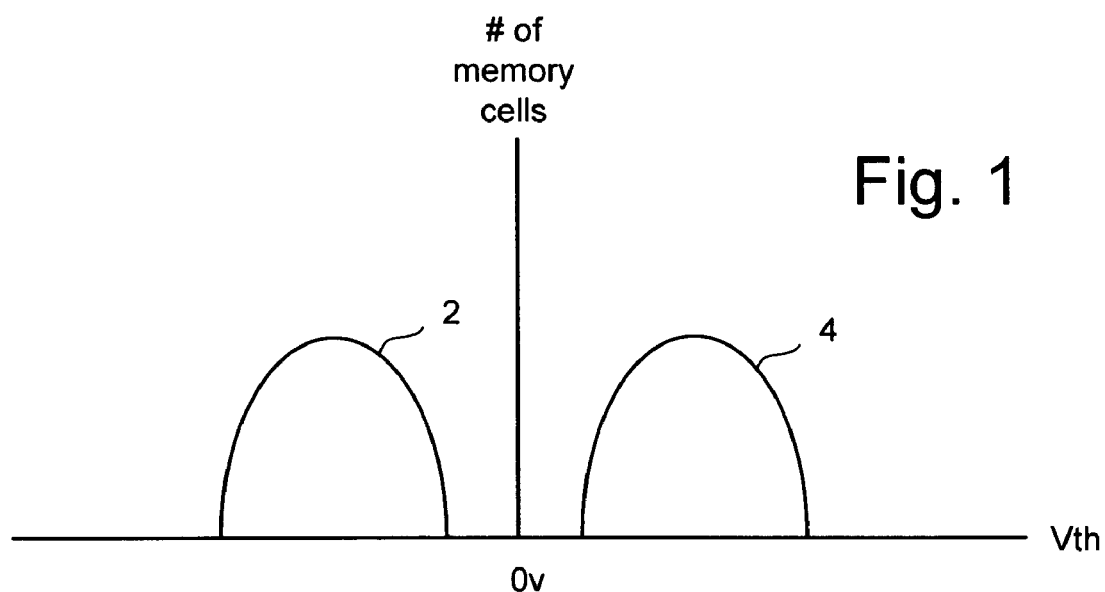
FIG. 1 is a graph depicting two threshold voltage distributions.
Figure 2:
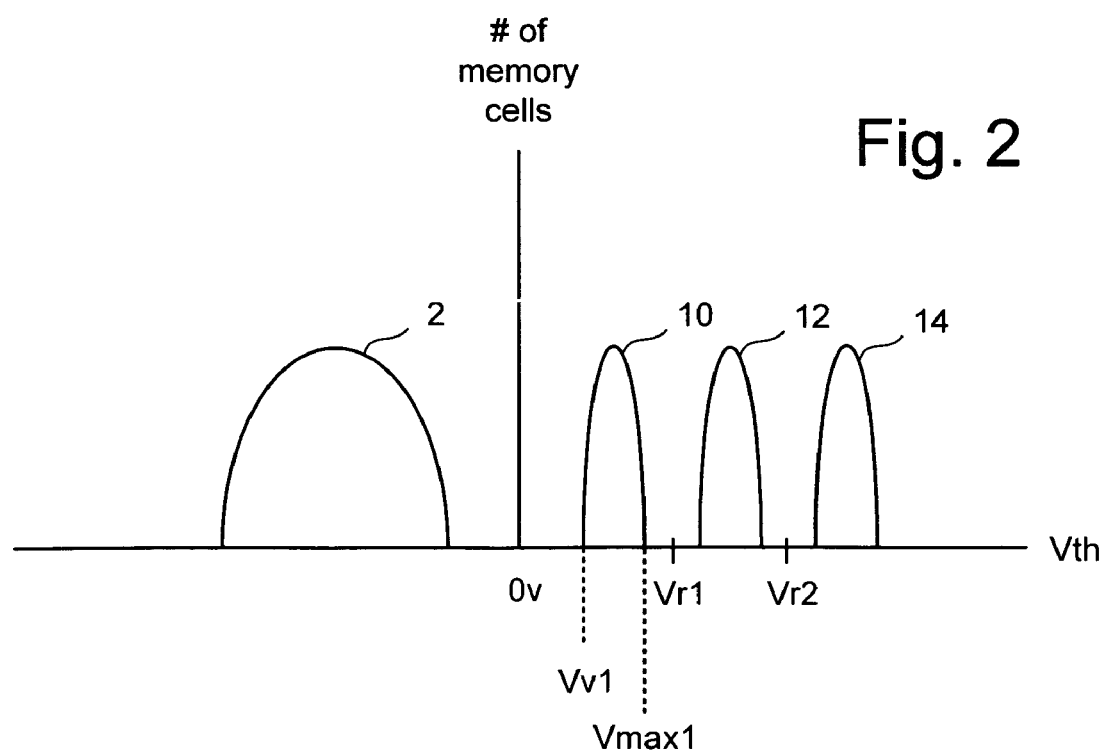
FIG. 2 is a graph depicting four threshold voltage distributions.
Figure 3C:
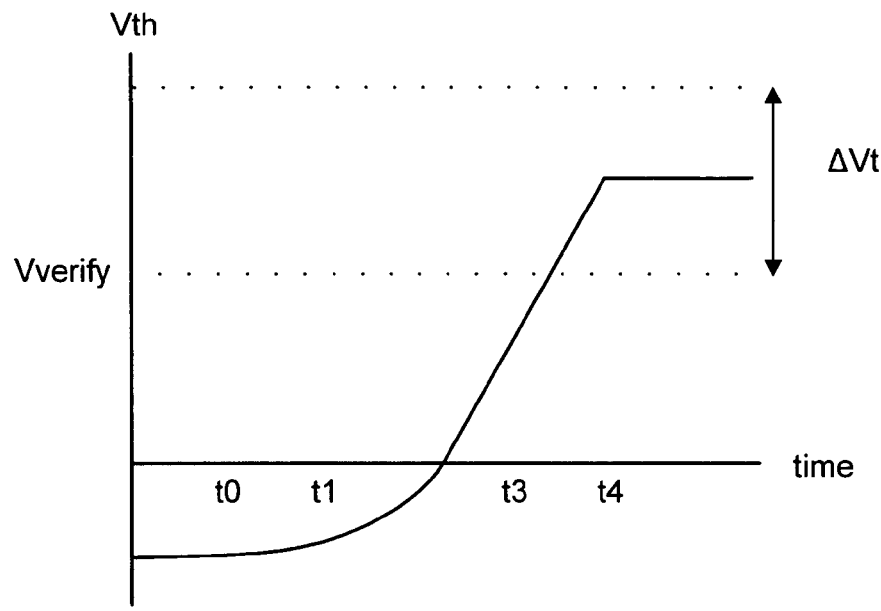
FIGS. 3A, 3B and 3C depict a programming process.
Figure 3B:
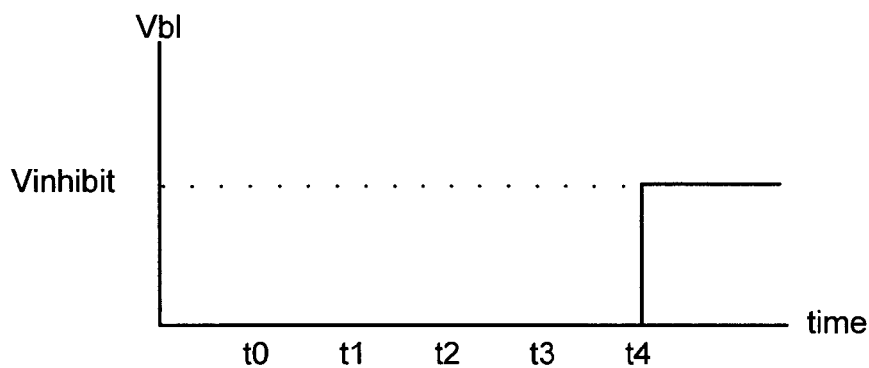
Figure 3A:
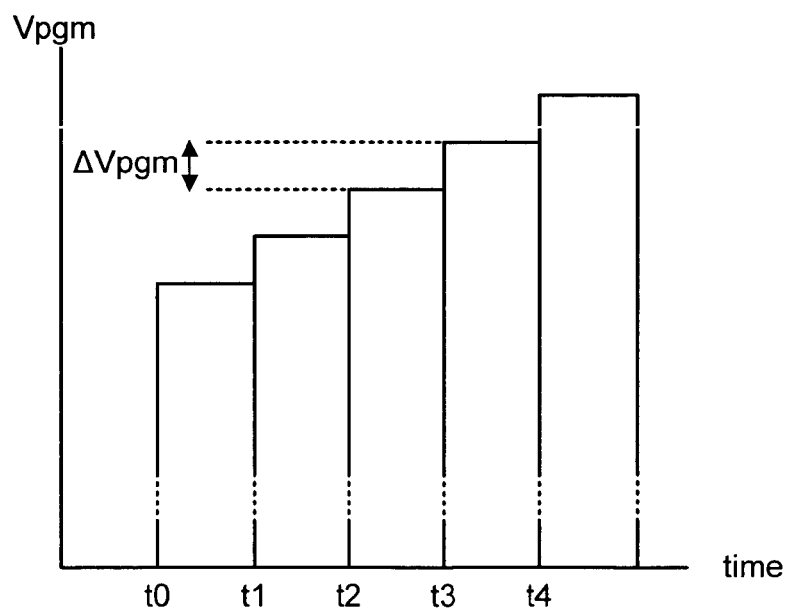
Figure 6:
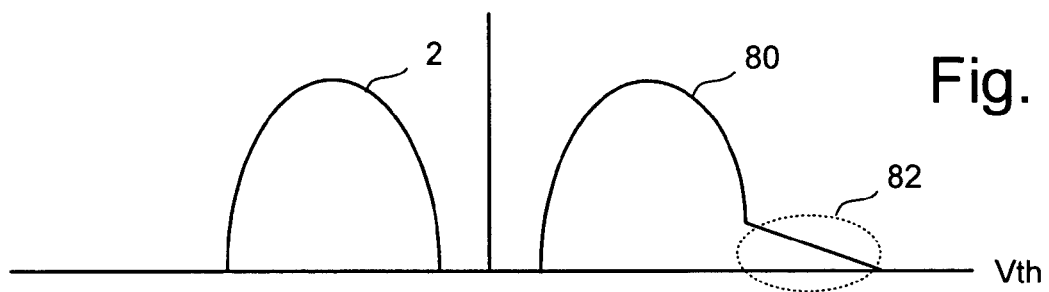
FIG. 6 is a graph depicting two threshold voltage distributions.
Figure 7A:
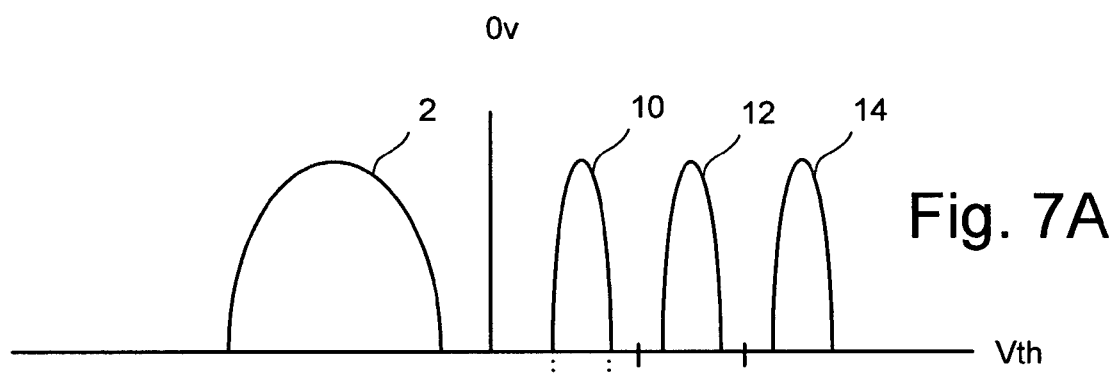
FIGS. 7A, 7B and 7C are graphs depicting threshold voltage distributions.
Figure 7B:
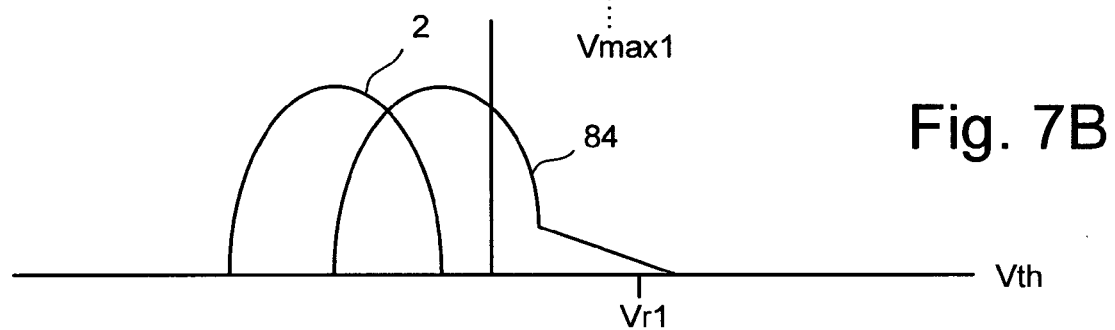
Figure 7C:
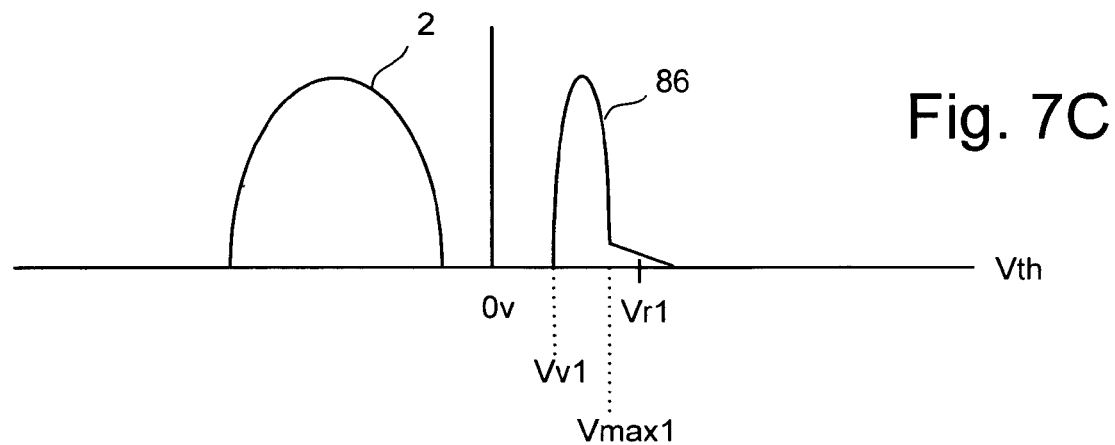
Figure 8:
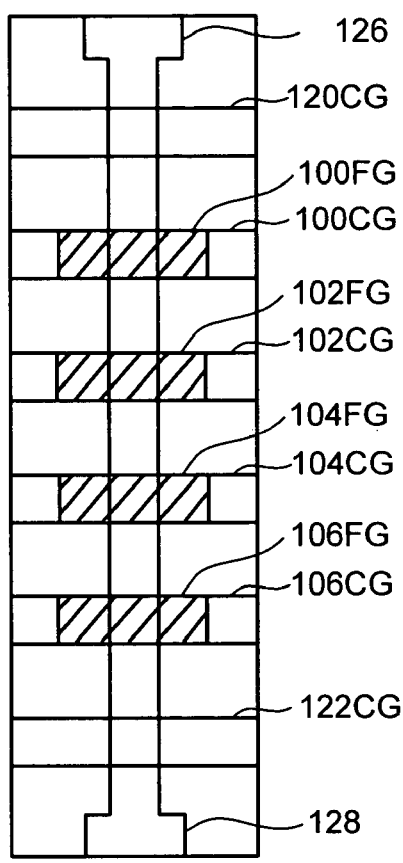
FIG. 8 is a top view of a NAND string.
Figure 9:
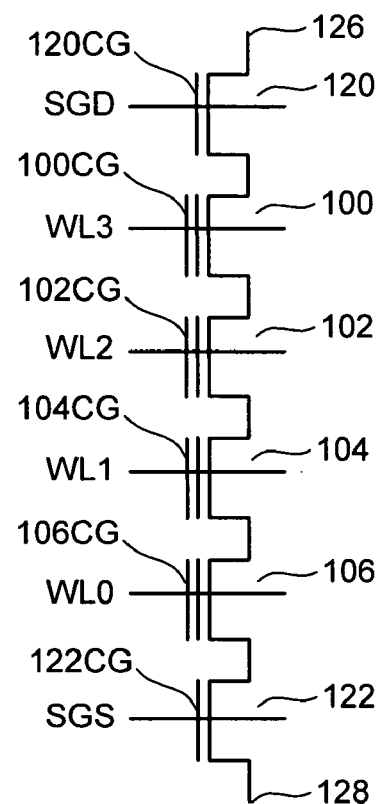
FIG. 9 is an equivalent circuit diagram of the NAND string.

One example of a flash memory system suitable for implementing the present invention uses the NAND structure, which includes arranging multiple transistors in series between two select gates. The transistors in series and the select gates are referred to as a NAND string. FIG. 8 is a top view showing one NAND string. FIG. 9 is an equivalent circuit thereof. The NAND string depicted in FIGS. 8 and 9 includes four transistors 100, 102, 104 and 106 in series and sandwiched between a select gate 120 and a second select gate 122. Select gate 120 connects the NAND string to bit line contact 126. Select gate 122 connects the NAND string to source line contact 128. Select gate 120 is controlled by the applying appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted in FIGS. 8 and 9. Select gate 120 is connected to select line SGD, and select gate 122 is connected to select line SGS.

Figure 10:
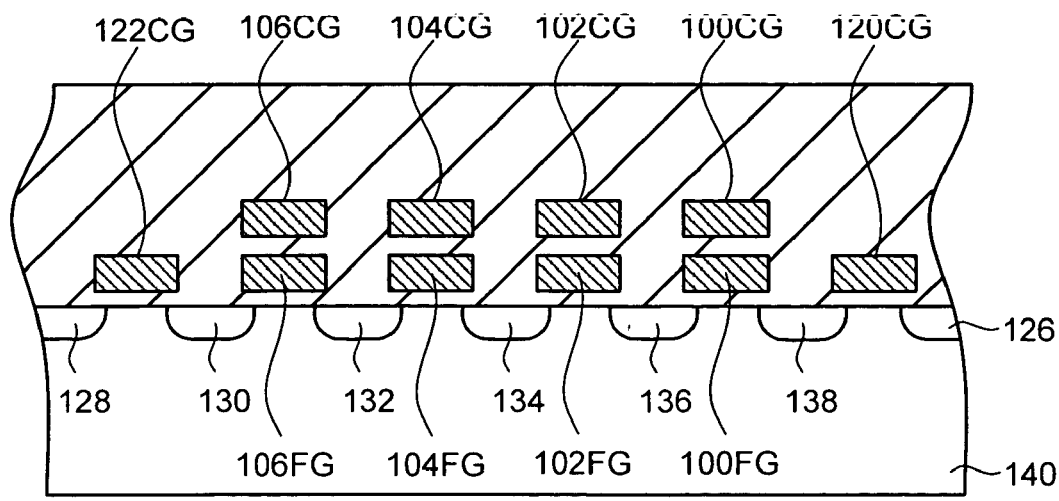
FIG. 10 is a cross sectional view of the NAND string.

FIG. 10 provides a cross-sectional view of the NAND string described above. As depicted in FIG. 10, the transistors of the NAND string are formed in p-well region 140. Each transistor includes a stacked gate structure that consists of the control gate (100CG, 102CG, 104CG and 106CG) and a floating gate (100FG, 102FG, 104FG and 106FG). The floating gates are formed on the surface of the p-well on top of an oxide film. The control gate is above the floating gate, with an inter-polysilicon dielectric layer separating the control gate and floating gate. The control gates of the memory cells (100, 102, 104, 106) form the word lines. N+ diffused layers 130, 132, 134, 136 and 138 are shared between neighboring cells, whereby the cells are connected to one another in series to form a NAND string. These N+ diffused layers form the source and drain of each of the cells. For example, N+ diffused layer 130 serves as the drain of transistor 122 and the source for transistor of 106, N+ diffused layer 132 serves as the drain for transistor 106 and the source for transistor 104, N+ diffused region 134 serves as the drain for transistor 104 and the source for transistor 102, N+ diffused region 136 serves as the drain for transistor 102 and the source for transistor 100, and N+ diffused layer 138 serves as the drain for transistor 100 and the source for transistor 120. N+ diffused layer 126 connects to the bit line for the NAND string, while N+ diffused layer 128 connects to a common source line for multiple NAND strings.

Note that although FIGS. 8–10 show four memory cells in the NAND string, the use of four transistors is only provided as an example. A NAND string can have less than four memory cells or more than four memory cells. For example, some NAND strings will include 8 memory cells, 16 memory cells, 32 memory cells, etc. The discussion herein is not limited to any particular number of memory cells in a NAND string.

Each memory cell can store data represented in analog or digital form. When storing one bit of digital data, the range of possible threshold voltages of the memory cell is divided into two ranges which are assigned logical data "1" and "0." In one example of a NAND type flash memory, the voltage threshold is negative after the memory cell is erased, and defined as logic "1." The threshold voltage after a program operation is positive and defined as logic "0." When the threshold voltage is negative and a read is attempted, the memory cell will turn on to indicate logic one is being stored. When the threshold voltage is positive and a read operation is attempted, the memory cell will not turn on, which indicates that logic zero is stored. A memory cell can also store multiple levels of information, thereby, storing multiple bits of digital data. In the case of storing multiple levels of data, the range of possible threshold voltages is divided into the number of storage levels. For example, if four levels of information are stored, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00."

Relevant examples of NAND type flash memories and their operation are provided in the following U.S. patents/patent Applications, all of which are incorporated herein by reference in their entirety: U.S. Pat. No. 5,570,315; U.S. Pat. No. 5,774,397; U.S. Pat. No. 6,046,935; U.S. Pat. No. 5,386,422; U.S. Pat. No. 6,456,528 and U.S. patent application Ser. No. 09/893,277 (Publication No. US2003/0002348). Information about programming NAND flash memory, including self boosting techniques, can be found in U.S. patent application Ser. No. 10/379,608, titled "Self Boosting Technique," filed on Mar. 5, 2003; and in U.S. patent application Ser. No. 10/629,068, titled "Detecting Over Programmed Memory," filed on Jul. 29, 2003, both applications are incorporated herein by reference in their entirety. Other types of flash memory devices can also be used with the present invention. For example, the following patents describe NOR type flash memories and are incorporated herein by reference in their entirety: U.S. Pat. Nos. 5,095,344; 5,172,338; 5,890,192 and 6,151,248. Another example of a flash memory type is found in U.S. Pat. No. 6,151,248, incorporated herein by reference in its entirety.

The technology described herein is not limited to floating gate type of memories, but may also be applicable to memory cells that use other types of material for the charge storage. For example, the technology described herein can be used with memory devices that uses various types of charge storage regions/layer(s) between the control gate (or wordline) and the substrate, such as a nitride layer or small silicon islands, better known as nano-crystals.

Figure 11:
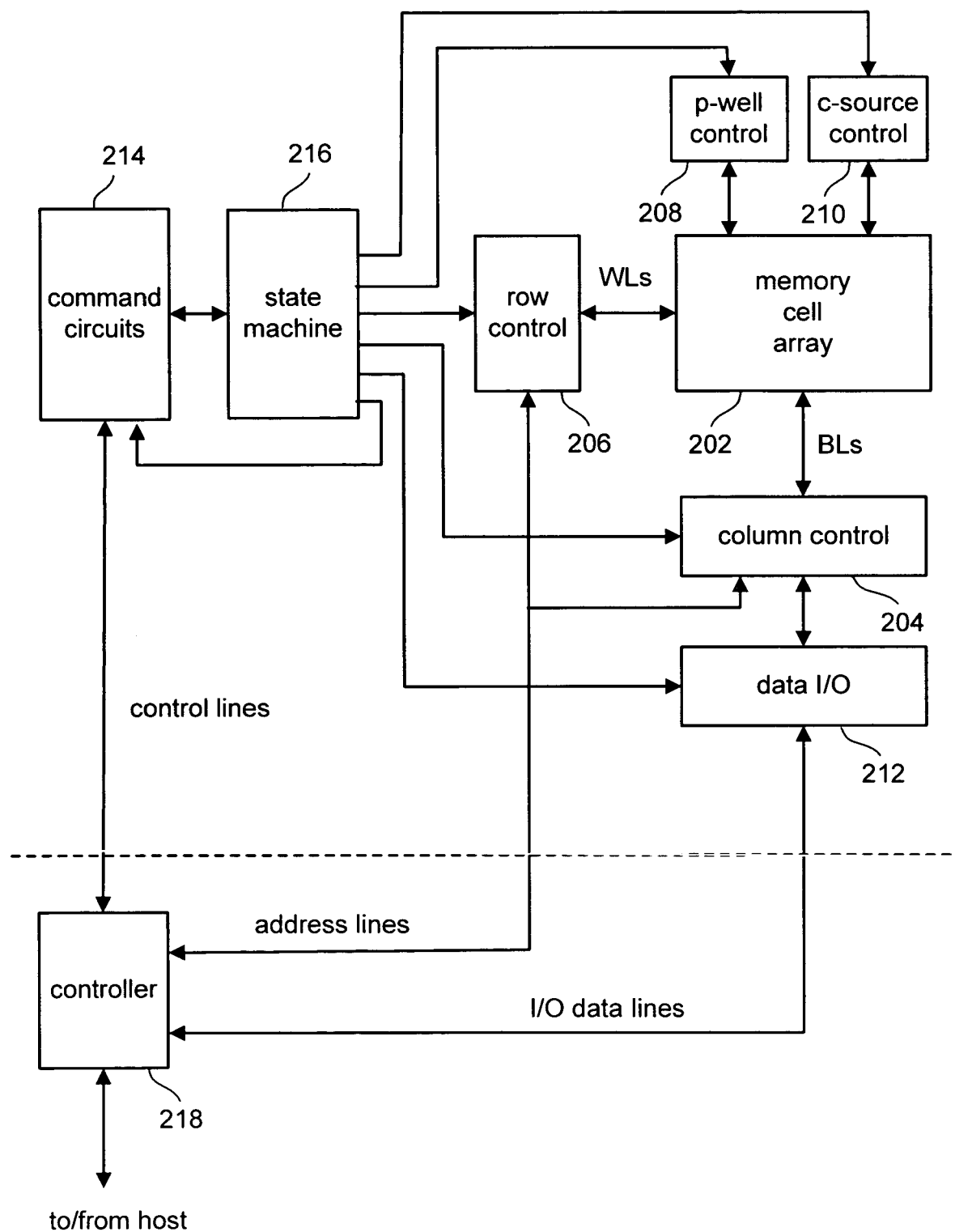
FIG. 11 is a block diagram of one embodiment of a non-volatile memory system.

FIG. 11 is a block diagram of one embodiment of a flash memory system that can be used to implement the present invention. Memory cell array 202 is controlled by column control circuit 204, row control circuit 206, c-source control circuit 210 and p-well control circuit 208. Column control circuit 204 is connected to the bit lines of memory cell array 202 for reading data stored in the memory cells, for determining a state of the memory cells during a program operation, and for controlling potential levels of the bit lines to promote the programming or to inhibit the programming. Row control circuit 206 is connected to the word lines to select one of the word lines, to apply read voltages, to apply program voltages and to apply an erase voltage. C-source control circuit 210 controls a common source line (labeled as "C-source" in FIG. 12) connected to the memory cells. P-well control circuit 208 controls the p-well voltage.

The data stored in the memory cells are read out by the column control circuit 204 and are output to external I/O lines via data input/output buffer 212. Program data to be stored in the memory cells are input to the data input/output buffer 212 via the external I/O lines, and transferred to the column control circuit 204. The external I/O lines are connected to controller 218.

Command data for controlling the flash memory device is input to controller 218. The command data informs the flash memory of what operation is requested. The input command is transferred to state machine 216, which controls column control circuit 204, row control circuit 206, c-source control 210, p-well control circuit 208 and data input/output buffer 212. State machine 216 can also output status data of the flash memory such as READY/BUSY or PASS/FAIL.

Controller 218 is connected or connectable with a host system such as a personal computer, a digital camera, personal digital assistant, etc. Controller 218 communicates with the host in order to receive commands from the host, receive data from the host, provide data to the host and provide status information to the host. Controller 218 converts commands from the host into command signals that can be interpreted and executed by command circuits 214, which is in communication with state machine 216. Controller 218 typically contains buffer memory for the user data being written to or read from the memory array.

One exemplar memory system comprises one integrated circuit that includes controller 218, and one or more integrated circuit chips that each contain a memory array and associated control, input/output and state machine circuits. The trend is to integrate the memory arrays and controller circuits of a system together on one or more integrated circuit chips. The memory system may be embedded as part of the host system, or may be included in a memory card (or other package) that is removably inserted into the host systems. Such a removable card may include the entire memory system (e.g. including the controller) or just the memory array(s) and associated peripheral circuits (with the Controller being embedded in the host). Thus, the controller (or control capability) can be embedded in the host or included within a removable memory system.

In some implementations, some of the components of FIG. 11 can be combined. In various designs, one or more of the components of FIG. 11, other than memory cell array 302, can be thought of as a control circuit. For example, one or more control circuits may include any one of or a combination of a command circuit, a state machine, a row control circuit, a column control circuit, a well control circuit, a source control circuit or a data I/O circuit.

Figure 12:
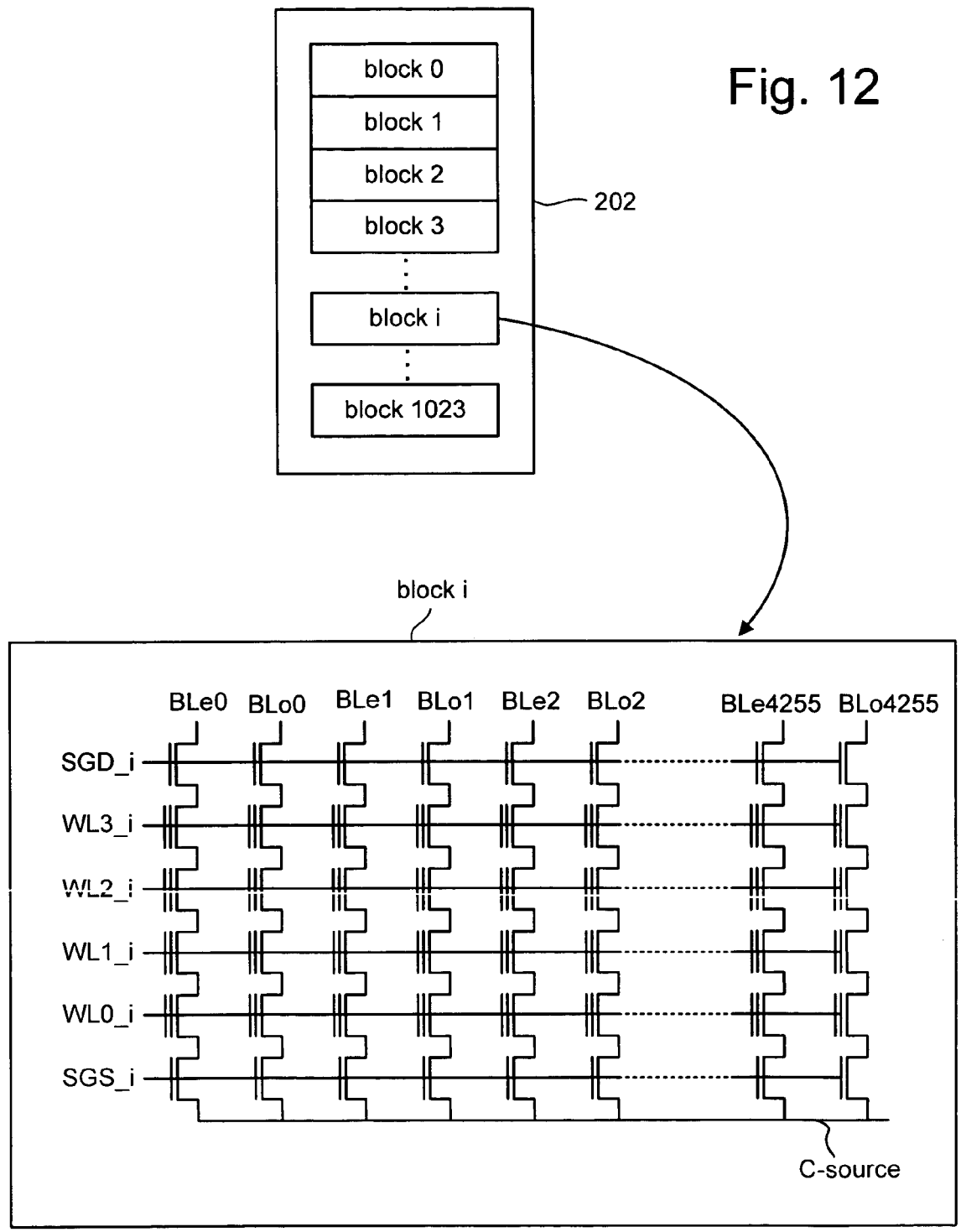
FIG. 12 illustrates an example of an organization of a memory array.

With reference to FIG. 12, an example structure of memory cell array 202 is described. As one example, a NAND flash EEPROM is described that is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 12 shows four memory cells connected in series to form a NAND string. Although four cells are shown to be included in each NAND string, more or less than four memory cells can be used. One terminal of the NAND string is connected to corresponding bit line via a select transistor SGD, and another terminal is connected to c-source via a second select transistor SGS.

During one embodiment of read and programming operations, 4,256 memory cells are simultaneously selected. The memory cells selected have the same word line and the same kind of bit line (e.g. even bit lines or odd bit lines). Therefore, 532 bytes of data can be read or programmed simultaneously. These 532 bytes of data that are simultaneously read or programmed form a logical page. Therefore, one block can store at least eight logical pages (four word lines, each with odd and even pages). When each memory cell stores two bits of data (e.g., multi-state memory cells), wherein each of these two bits are stored in a different page, one block stores 16 logical pages. Other sized blocks and pages can also be used with the present invention. Additionally, architectures other than that of FIGS. 11 and 12 can also be used to implement the present invention.

Memory cells are erased by raising the p-well to an erase voltage (e.g. 20 volts) and grounding the word lines of a selected block. The source and bit lines are floating. Erasing can be performed on the entire memory array, separate blocks, or another unit of cells. Electrons are transferred from the floating gate to the p-well region and the threshold voltage becomes negative (in one embodiment).

In the read and verify operations, the select gates (SGD and SGS) and the unselected word lines (e.g., WL0, WL2 and WL3) are raised to a read pass voltage (e.g. 4.5 volts) to make the transistors operate as pass gates. The selected word line (e.g. WL1) is connected to a voltage, a level of which is specified for each read and verify operation in order to determine whether a threshold voltage of the concerned memory cell is above or below such level. For example, in a read operation for a two level memory cell, the selected word line WL1 may be grounded, so that it is detected whether the threshold voltage is higher than 0V. In a verify operation for a two level memory cell, the selected word line WL1 is connected to 0.8V, for example, so that it is verified whether or not the threshold voltage has reached at least 0.8V. The source and p-well are at zero volts. The selected bit lines (BLe) are pre-charged to a level of, for example, 0.7V. If the threshold voltage is higher than the read or verify level on the word line, the potential level of the bit line (BLe) associated with the cell of interest maintains the high level because of the non-conductive memory cell. On the other hand, if the threshold voltage is lower than the read or verify level, the potential level of the concerned bit line (BLe) decreases to a low level, for example less than 0.5V, because of the conductive memory cell discharging the bitline. The state of the memory cell is thereby detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

As described above, programming of the memory cells in the memory array is accomplished by applying a program voltage Vpgm as a series of pulses to the control gates of the memory cells. The choice of the magnitude of Vpgm is a compromise. Too high of a value will result in more fast cells being over-programmed, while a too low of a value will result in an unreasonable reduction in the programming speed. The number of fast cells that may cause over-programming is relatively small in comparison to the total number of memory cells in a memory system. As a result, when a page of memory cells is programmed, the probability that there will be one or more fast memory cell in such a page is not very high. This would mean that if a low Vpgm is used to avoid over-programming, most pages would unnecessarily suffer in terms of programming speed since the number of required programming pulses is mainly determined by the start value of Vpgm. In reality, only a small number of the total pages in a memory system need a low Vpgm value, while other pages could be programmed with a higher Vpgm to avoid degradation in performance. To solve this dilemma, the following process is proposed.

First, a low initial value for Vpgm is used for the first programming pulse such that no memory cells (or only a small number of memory cells) will be over-programmed during the first programming pulse (or first two or three pulses). To reduce the impact on programming time for pages with no fast memory cells, the subsequent programming pulses will be increased in magnitude with a larger step size (e.g., 0.6 v, instead of a typical value of 0.3 v). The value of Vpgm will be quickly increased by the larger step size until the first set of one or more cells (or other minimum number) have reached an initial verify level (Vvstart). Thus, not much time is lost and the total number of programming pulses may be similar or even less than other systems.

In the case where one or more fast memory cells are present in a page being programmed, then these fast memory cells would be detected after the first pulse. However, depending on what value for Vpgm is used, more then one program pulse maybe needed before any fast cells are detected. In some pages, a fast cell or cells maybe detected after the first pulse, in other pages a fast cell or cells maybe detected after two or more pulses, while in other pages, no fast cells maybe detected at all. Subsequent programming pulses will be increased with a smaller step size in order to avoid over-programming of those fast memory cells. Such a page with fast memory cells would need a large number of programming pulses since the step size is small from the beginning. Since a majority of the pages in the memory array will not have any fast cells and, therefore, will not be slowed down too much, the overall programming speed will not unreasonably suffer. Only for pages where it is needed, the programming will be slower to avoid over-programming.

Figure 13:
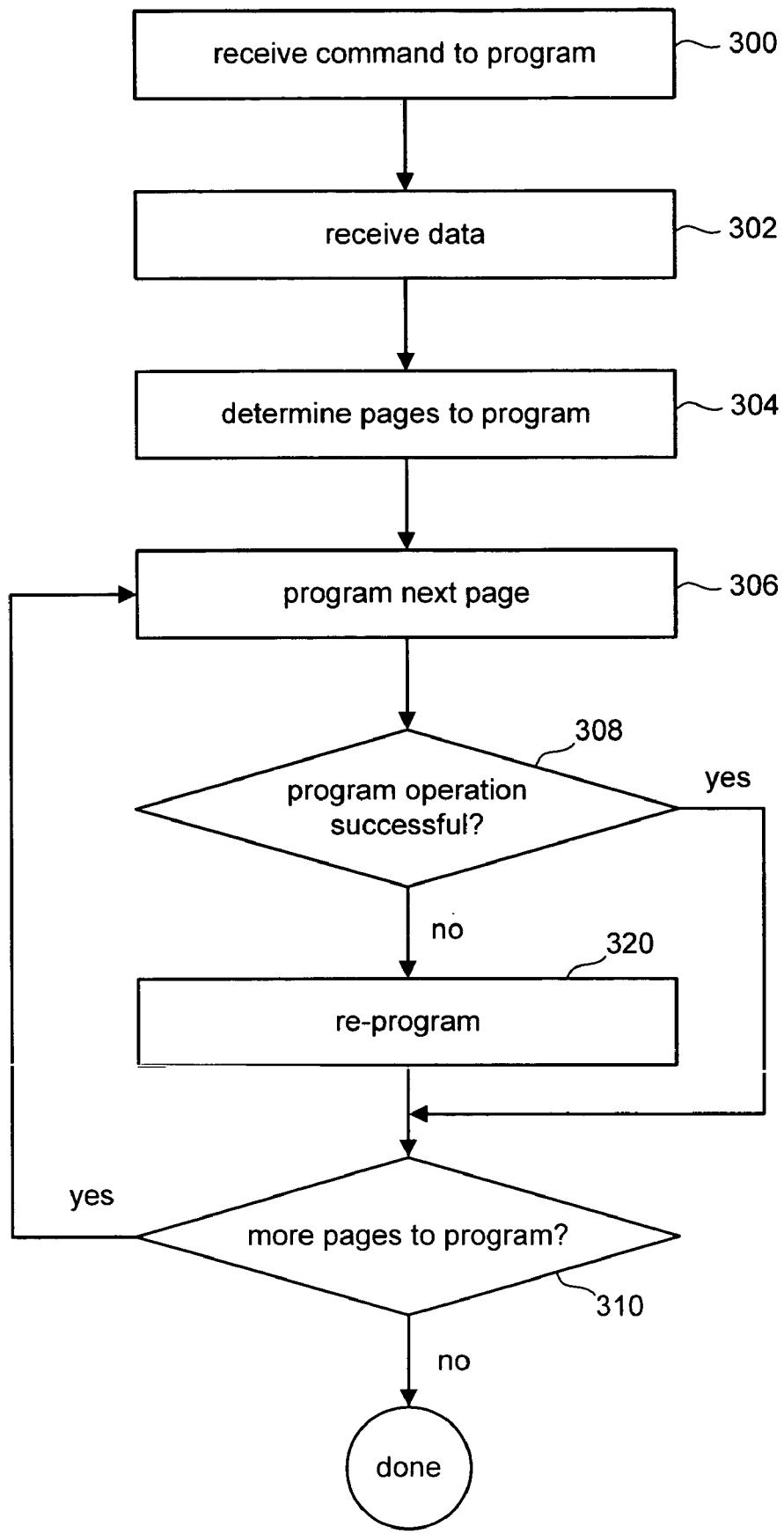
FIG. 13 is a flow chart describing one embodiment of a process for programming pages of a memory system.

FIG. 13 is a flow chart describing one embodiment of a process for programming a memory system. In step 300, command circuits 214 (FIG. 11) receives a command from controller 318 to program a set of data. In step 302, the data is received. In step 304, the system determines which pages of data need to be programmed. After determining which pages to program, state machine 216 will direct the programming of the appropriate pages. In step 306, the next page is programmed. In step 308, it is determined whether the operation was successful. If the page was programmed successfully, then it is determined whether there are more pages to program (step 310). If there are no more pages to program, then the process of FIG. 13 is completed. If there are more pages to program, then the process loops back to step 306 and the next page is programmed.

If a program operation was not successful (see step 308), then that page is re-programmed in step 320. Step 320 can also include performing various error-correction techniques or canceling the program operation. After step 320, the process may continue at step 310.

In some embodiments, the various pages to be programmed can also be pre-processed prior to programming.

For example, pre-programming can be performed on the various pages so that all of the memory cells that were still in the erased state are programmed to a common level. After pre-programming, all of the pages can be erased. After erasing, soft programming can be performed to raise the threshold voltage of memory cells that were over-erased.

Figure 14:
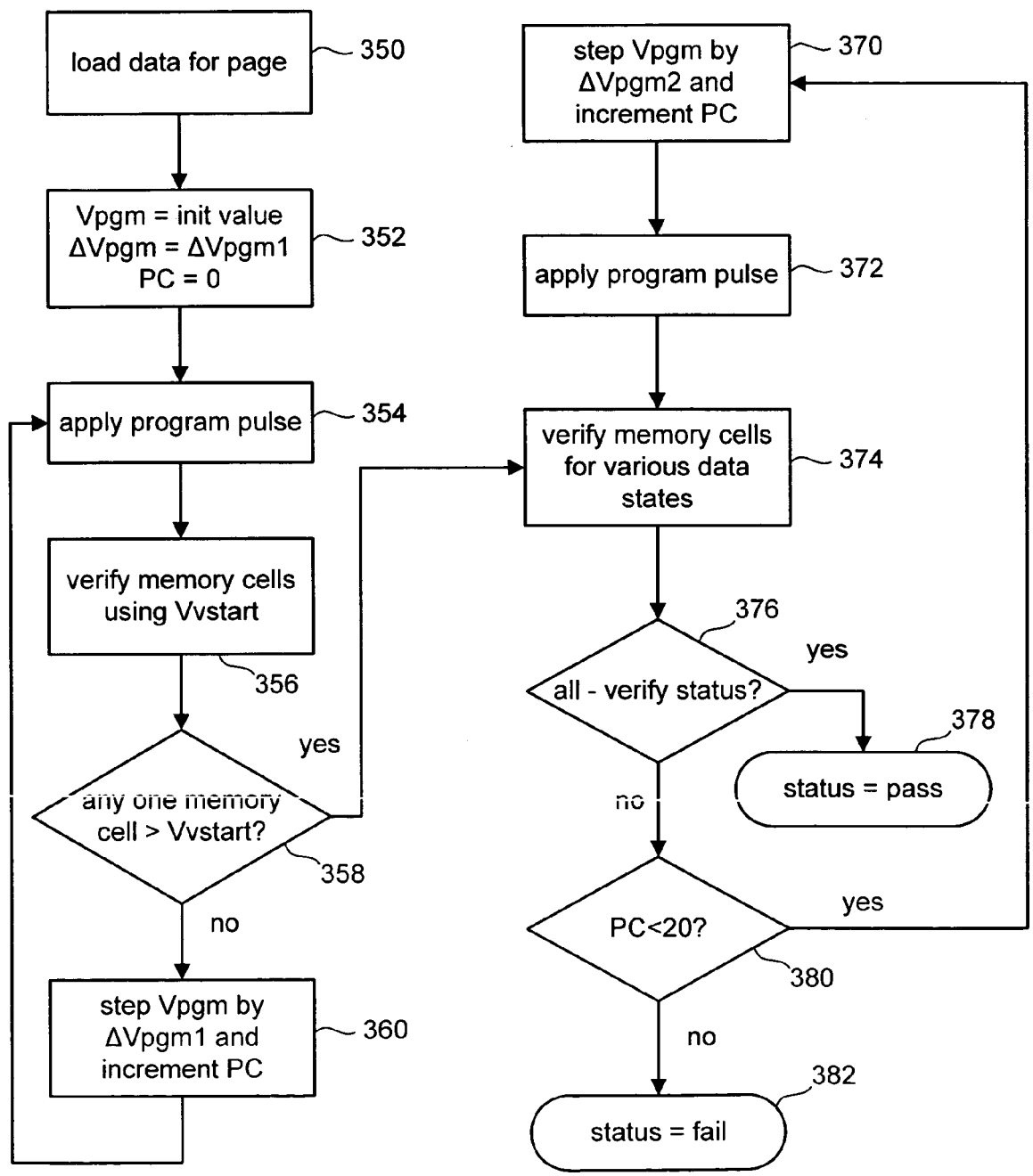
FIG. 14 is a flow chart describing one embodiment of a process for programming a page of a memory system.

FIG. 14 is a flow chart describing one embodiment of a process for programming a page of data (see step 306 of FIG. 13). In step 350, data is loaded for that particular page. In step 352, the program voltage Vpgm is set to its initial low value, the increment value ΔVpgm is set to a first increment value ΔVpgm1 and the program counter PC is initialized to zero. The value of the first program pulse is set with a magnitude low enough so that none or only a sufficiently small number of the non-volatile storage elements (even fast non-volatile storage elements) being programmed will be over-programmed (e.g., 15V). In step 354, the first program pulse is applied. Because the magnitude is set low enough, none or only a sufficiently small number of the memory cells should become over-programmed after the first programming pulse. As discussed above, in one embodiment, the memory cells in a page of data share a common word line and, thus, receive the same programming pulses at their respective control gates. After the program pulse, the memory cells are then verified against a voltage Vvstart in step 356. The voltage value Vvstart is used to determine which memory cells are fast memory cells. It is chosen by device characterization so that any cells that pass Vvstart after one programming pulse are considered fast memory cells. If none of the memory cells for the particular page being programmed have a threshold voltage greater than Vvstart, then in step 360 the program voltage is incremented by ΔVpgm1 and the program counter PC is incremented by 1. Note that in some embodiments it maybe preferred to increase the program counter with a different value than 1 in order to reflect the larger step size. For example, the loop counter could be increased by a value of 2 in case the larger step size is two times larger than the smaller step size. After step 360, the process loops back to step 354 and the next program pulse is applied. Step 354–358 will be iterated until at least one memory cell has a threshold voltage greater than Vvstart.

Note that in one embodiment, step 358 will use a different minimum number (other than one memory cell) to test whether there are a sufficient number of memory cells with a threshold voltage greater than Vvstart. The number used varies by implementation. However, the number tested should be a number less than all of the memory cells that are successfully programmed.

When, in step 358, it is determined that one or more memory cells (or a different minimum number) have a threshold voltage greater than Vvstart, then the process continues as step 374, at which time all of the memory cells are verified against the various verify levels for the different program states. In one embodiment, the iterations of step 354–360 include only verifying the memory cells against Vvstart in order to find one or more (or another minimum number) of memory cells that have a threshold voltage greater than Vvstart. After one or more memory cells are found to have a threshold voltage greater than Vvstart, all memory cells are verified against the various targets (or targets and coarse/fine verify levels, as appropriate by the implementation). For example, if coarse/fine programming is used, each memory cell will be verified against a coarse/fine verify level and a final target verify level for each of the various program states (step 374).

Note that different types of coarse/fine algorithms can be implemented, it is for example possible to verify first only against a coarse level of a certain desired state and start verifying against a fine level after the first cell has passed the coarse level of that state. Furthermore, if multiple levels are programmed at the same time, coarse/fine programming for the higher levels can be postponed for a certain number of programming pulses. Another possibility is to start coarse verifying for the higher levels a certain number of pulses after coarse verifying of a lower state has detected one or more cells passing that lower state coarse level. Using the above methods, the total number of required verify operations can be minimized, thereby reducing the total required programming time.

If all of the memory cells are verified to have reached their intended target level (step 376), then the process is complete and status is set to pass (step 378). In some embodiments, the programming process can complete successfully if less than all memory cells reach their intended target. For example, in some embodiments if almost all memory cells reach their intended target (e.g., with no more than a predetermined number of cells not reaching their target), the process is successful. Memory cells that have not reached their target can be taken care of when read using error correction or the data can be programmed elsewhere in the memory array in case too many cells have failed to reach their target. If not all of the memory cells verify (which is likely the first time step 374 is performed), then it is determined whether the program counter is less than 20 (or another suitable value). If the program counter is at 20 (or any other suitable value) or greater, then too many steps have been performed and the process fails (step 382). If the program counter is still less than 20 (or any other suitable value), then the program voltage is stepped by ΔVpgm2 and the program counter is incremented by one in step 370. Note that in some embodiments, the program counter maybe incremented with a value different from one to take the difference in step sizes into account. Note that ΔVpgm2 is a smaller step size than ΔVpgm1. Thus, the program voltage Vpgm increases much faster during the iterations of step 354–360, as compared to the slower rising of the program voltage Vpgm during the iterations of step 370–372. In step 372, another program pulse is applied. In step 374, the memory cells are verified, as discussed above, and the process continues at step 376.

Figure 15A:
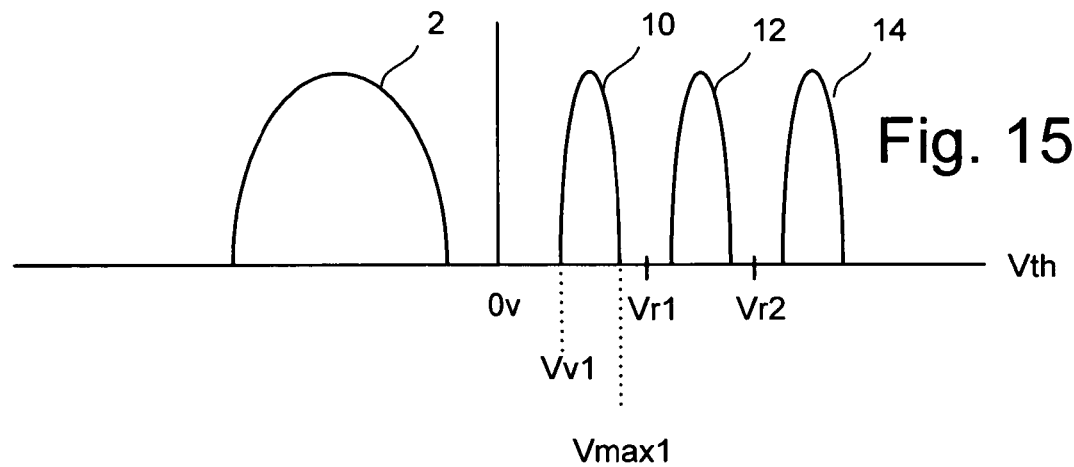
FIGS. 15A, 15B and 15C are graphs depicting threshold voltage distributions.
Figure 15B:
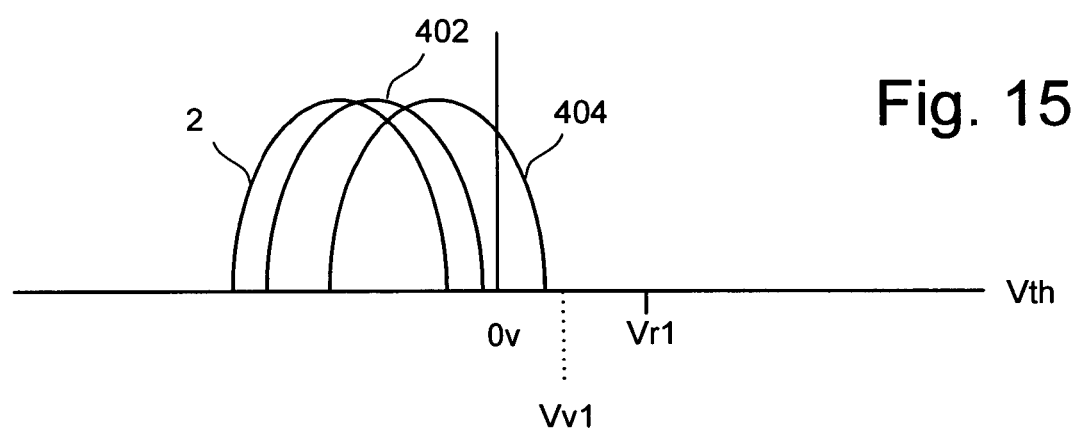
Figure 15C:
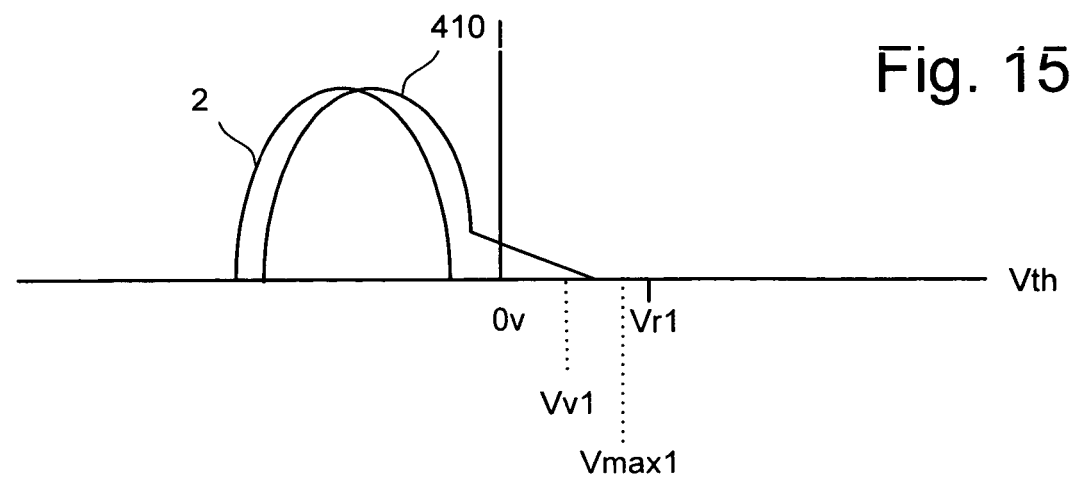

The behavior of the memory cells is described with respect to FIGS. 15A, 15B, and 15C. FIG. 15A shows the threshold voltage distributions 2, 10, 12, and 14 for two bit multi-state cells. Note, however, the technology described herein applies to memory cells storing more and less than two bits of data. Also depicted in FIG. 15A are read verify points Vr1 and Vr2. Read verify point Vr1 is for distinguishing between threshold voltage distributions 10 and 12. Read verify point Vr2 is for distinguishing between threshold voltage distributions 12 and 14. Zero volts can be used to distinguish between threshold voltage distributions 2 and 10. FIG. 15A also shows voltage level Vv1 as the lowest voltage of threshold voltage distribution 10 and Vmax1 as the upper voltage limit of voltage distribution 10.

FIG. 15B shows erased threshold voltage distribution 2 and programmed threshold voltage distributions 402 and 404 when no fast memory cells are present in the page. In this case, verify level Vv1 represents the final target verify level and zero volts can be used as Vvstart. It can been seen that the threshold voltage distribution 402 after the first pulse shifts up from the erased level to a certain extent; however, none of the memory cells have reached the Vvstart (0 v) yet, so programming continues with a second pulse that has a Vpgm increased by the increment ΔVpgm1. As a result, the threshold voltage distribution shifts up with a value close to ΔVpgm1. Note that this amount of shift may vary and strongly depends on the amplitude of the initial Vpgm pulse. After the second pulse, a number of memory cells in distribution 404 have reached a threshold voltage above Vvstart (0 volts). Thus, Vpgm will be subsequently increased with the smaller step size ΔVpgm2.

FIG. 15c shows erased threshold voltage distribution 2 and programmed threshold voltage distribution 410 when fast memory cells are present. After the first programming pulse (e.g., threshold voltage distribution 410) a number of cells have a threshold voltage greater than the Vvstart (0 volts). Some memory cells may have a threshold voltage greater than Vv1. Thus, the step size for the following programming pulse will be equal to ΔVpgm2 to avoid over-programming.

Figure 16C:
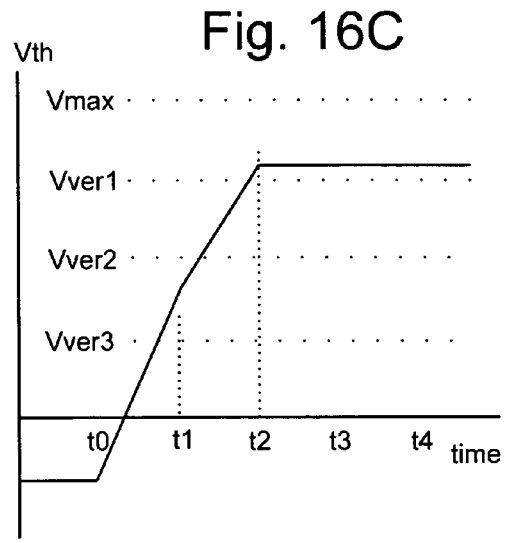
FIGS. 16A, 16B and 16C depict one embodiment of a programming process that reduces over programming.
Figure 17C:
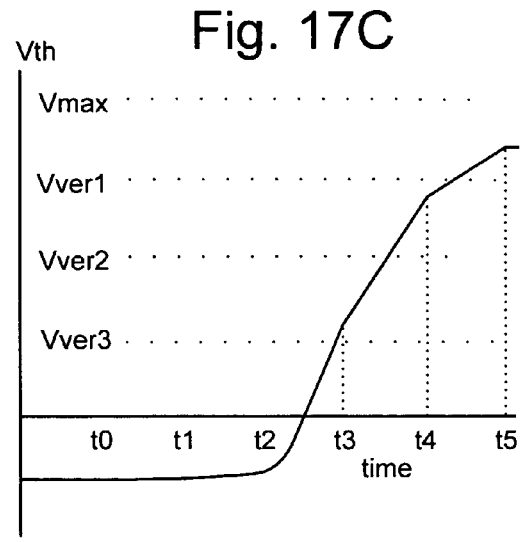
FIGS. 17A, 17B and 17C depict one embodiment of a programming process that reduces over programming.
Figure 16B:
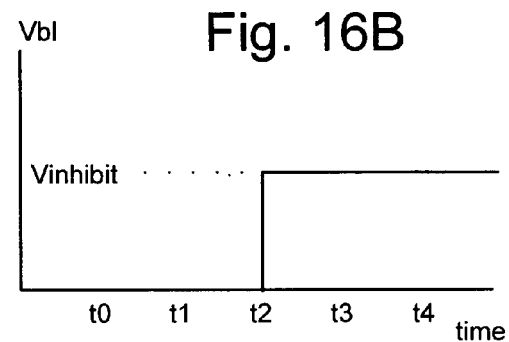
Figure 17B:
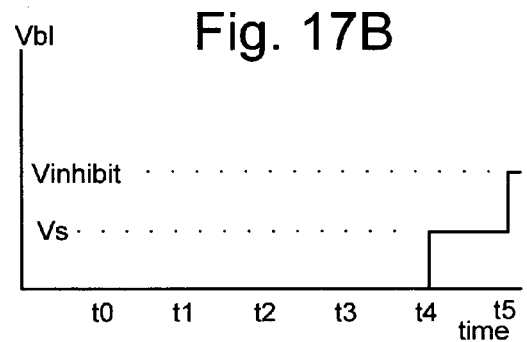
Figure 16A:
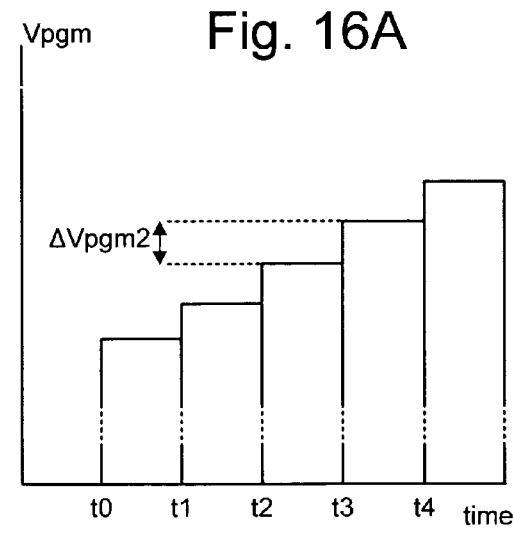
Figure 17A:
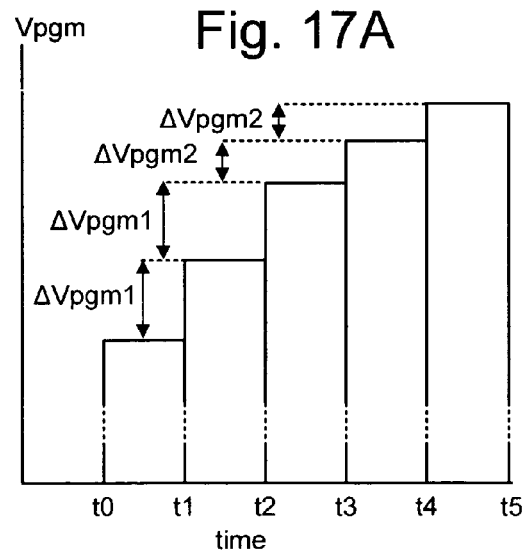

FIGS. 16 and 17 include graphs that depict the use of the technology described in conjunction with coarse/fine programming. FIGS. 16A, 16B, and 16C depict the behavior of a fast memory cell which has a threshold voltage that passes both the course and target verify levels in the same pulse so that the memory cell does not enter the fine mode. FIGS. 17A, 17B, and 17C depict a slower memory cell that participates in both the coarse and fine modes. FIGS. 16A and 17A depict programming pulses Vpgm applied to the control gates of the memory cells being programmed. FIGS. 16B and 17B depict bit line voltages Vb1 for the memory cells being programmed. FIGS. 16C and 17C depict the threshold voltages for the memory cells being programmed.

With respect to FIGS. 16A, 16B, and 16C a fast memory cell is depicted. In response to a first pulse that starts at time t0, the memory cell's threshold voltage is raised above Vver3. Note that the verify level Vver3 corresponds to Vvstart of FIG. 14. Therefore, the page that includes this memory cell is programmed more slowly. As such, the magnitude of subsequent programming pulse will increase by ΔVpgm2. In between t1 and t2, the threshold voltage of the memory cell rises above both Vver2 and Vver1. At t2, the bit line voltage will be raised to Vinhibit in order to inhibit any further programming. Note that in one embodiment, Vver3 may be 0.2 v to 0.3 v lower than the Vver 2 for the lowest programmed state.

With respect to the slower memory cell of FIG. 17, the threshold voltage of the memory cell will not rise above Vver3 until the period between t2 and t3. Thus, programming pulses will increment by ΔVpgm1 prior to t3. Because the threshold voltage in the memory cell in the page is greater than Vver3 at t3, then the increment value is changed at t3 to ΔVpgm2, and subsequent pulses increase in magnitude by ΔVpgm2. The threshold voltage in the memory cell increases above Vver2 between t3 and t4, therefore, the memory cell enters the fine programming phase and the bit line is raised to Vs at t4. In between t4 and t5, the threshold voltage increase is slowed down due to the increase in bit line voltage and due to the decrease in the Vpgm increment value. However, the threshold voltage does become greater than Vver1 between t4 and t5; therefore, the threshold voltage has reached its target level and the bit line voltage is raised to Vinhibit in order to inhibit further programming at t5.

Note that FIGS. 16A and 17A show the programming pulses adjacent each to each other to make the graph easier to read. However, there are actually time spaces between the pulse to allow for the verify operations.

Figure 18C:
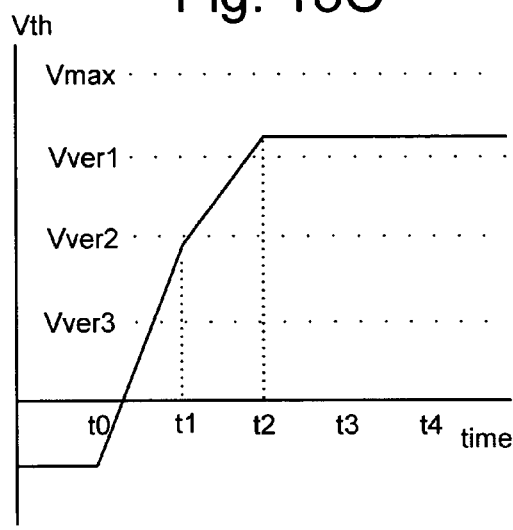
FIGS. 18A, 18B and 18C depict one embodiment of a programming process that reduces over programming.
Figure 19C:
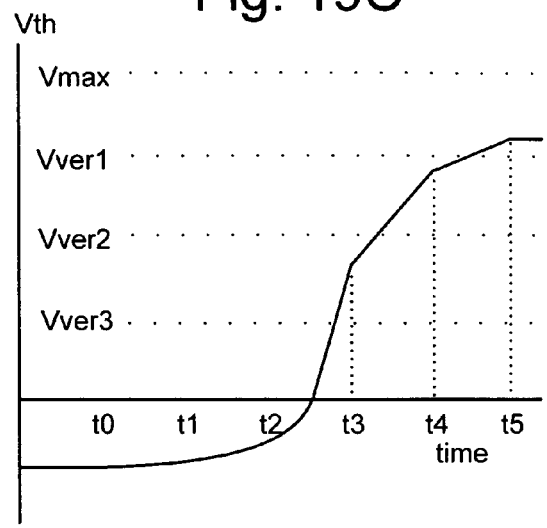
FIGS. 19A, 19B and 19C depict one embodiment of a programming process that reduces over programming.
Figure 18B:
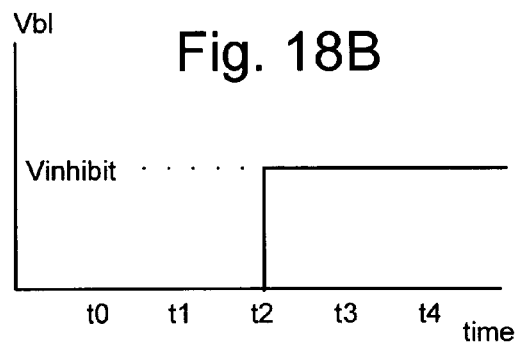
Figure 19B:
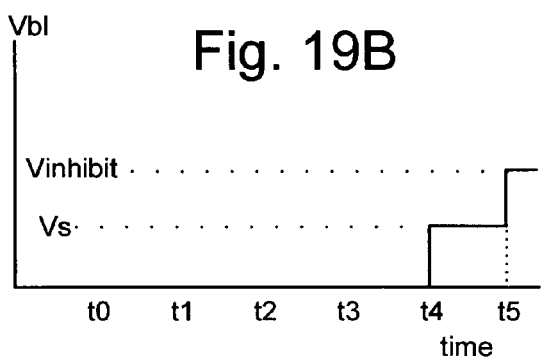
Figure 18A:
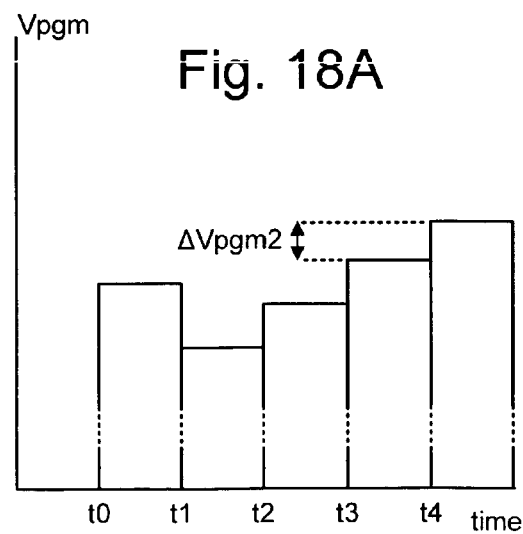
Figure 19A:
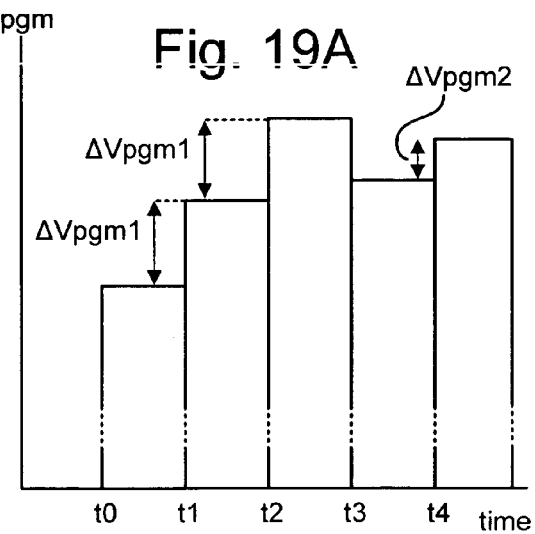

FIGS. 18 and 19 describe another embodiment for using the technology described herein to avoid or reduce over-programming. This embodiment pertains to an initial set of one or more pulses until one or more memory cells reach the Vver3 level and then resetting the program voltage magnitude to a lower level for subsequent programming pulses. This embodiment also uses the coarse/fine methodology. FIGS. 18A, 18B, and 18C correspond to a fast memory cell, while FIGS. 19A, 19B, and 19C correspond to a slower memory cell. FIGS. 18A and 19A depict the program pulses Vpgm. FIGS. 18B and 19B depict the bit line voltage Vb1. FIGS. 18C and 19C depict the threshold voltage of the memory cell being programmed over time.

As depicted in FIG. 18A, a first pulse is provided at time t0. The magnitude of this first pulse is determined so that no or only a sufficiently small number of memory cells will be over-programmed. FIG. 18C shows a fast memory cell with a threshold voltage that becomes higher than Vver3 in between times t0 and t1. Therefore, the associated page of memory cells will be programmed slower using ΔVpgm2. However, prior to providing any further pulses, the magnitude of Vpgm is lowered, for example by a value of 0.3–0.5V. Thus, FIG. 18A shows the magnitude of the pulse starting at t1 to be lower than the magnitude of the pulse that starts at t0. After t1, each subsequent pulse is increased by ΔVpgm2. Between t1 and t2, the threshold voltage of the memory cell is raised to a level higher than Vver1; therefore, the bit line is raised to Vinhibit at t2 (See FIG. 18B).

FIG. 19A shows the case where the memory cell programs more slowly. Thus, the memory cell does not have its threshold voltage reach Vver3 until the period between t2 and t3. Therefore, prior to t3, the pulses are incremented by ΔVpgm1. After t3, the increment value for Vpgm will be changed to ΔVpgm2. Additionally, the magnitude of the pulses will be reset to a lower value. For example, FIG. 19a shows the pulse starting at t3 to be lower than the pulse starting at t2. The increment value for additional pulses after t3 is ΔVpgm2. At t4 it is verified that the threshold voltage is greater than Vver2, but less that Vver1, therefore, the memory cell enters the fine programming phase and the bit line voltage is raised to Vs. At t5, it is verified that the threshold voltage of the memory cell is greater than Vver1; therefore, the memory cell is inhibit from further programming by raising the bit line voltage to Vinhibit.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A method for programming non-volatile storage, comprising:
   determining whether a set of non-volatile storage elements includes at least a minimum number of fast programming non-volatile storage elements;
   programming said set of non-volatile storage elements with a slower rising control gate voltage signal if said set of non-volatile storage elements includes at least said minimum number of fast programming non-volatile storage elements; and programming said set of non-volatile storage elements with a faster rising control gate voltage signal if said set of non-volatile storage elements does not include at least said minimum number of fast programming non-volatile storage elements, said minimum number of fast programming non-volatile storage elements is less than all non-volatile storage elements of said set of non-volatile storage elements that are successfully programmed.

2. A method according to claim 1, wherein said programming said set of non-volatile storage elements with a faster rising control gate voltage signal comprises:
programming said set of non-volatile storage elements with said faster rising control gate voltage signal until a first subset of said set of non-volatile storage elements have reached a first level and subsequently programming said set of non-volatile storage elements with said slower rising control gate voltage signal until at least a large subset of said set of non-volatile storage elements reach one or more target levels.

3. A method according to claim 2, wherein:
said programming said set of non-volatile storage elements with said slower rising control gate voltage signal includes performing a coarse programming mode and a fine programming mode;
said coarse programming mode includes using a lower bit line voltage; and
said fine programming mode includes using a higher bit line voltage.

4. A method according to claim 2, wherein said programming said set of non-volatile storage elements with said slower rising control gate voltage signal comprises:
programming said set of non-volatile storage elements with a first bit line voltage until each of said non-volatile storage elements reaches one or more coarse/fine verify levels, said set of non-volatile storage elements are multi-state flash memory devices; and
programming said set of non-volatile storage elements with a second bit line voltage until at least a second subset of said non-volatile storage elements reach said one or more target levels.

5. A method according to claim 1, wherein:
said step of determining includes applying a program pulse to said set of non-volatile storage elements and determining whether at least one of said set of non-volatile memory elements has reached a predetermined programming level, said program pulse has a magnitude set low enough so that none or at least a strongly reduced number of said set of non-volatile storage elements become over programmed from said program pulse.

6. A method according to claim 1, wherein:
said slower rising control gate voltage signal includes a set of pulses with a magnitude increasing at a first rate; and
said faster rising control gate voltage signal includes a set of pulses having a magnitude increasing at a second rate and subsequently increasing at said first rate, said first rate is lower than said second rate.

7. A method according to claim 1, wherein:
all non-volatile storage elements in said set of non-volatile storage elements receive a common control gate voltage signal.

8. A method according to claim 1, wherein:
said minimum number of fast programming non-volatile storage elements is equal to one fast programming non-volatile storage element.

9. A method according to claim 1, wherein said programming said set of non-volatile storage elements with said slower rising control gate voltage signal if said set of non-volatile storage elements includes said minimum number of one or more fast programming non-volatile storage elements comprises:
lowering a magnitude of said control gate voltage.

10. A method according to claim 9, wherein said programming said set of non-volatile storage elements with a faster rising control gate voltage signal comprises:
continuing to raise said control gate voltage signal until a subset of said set of non-volatile storage elements have reached a first level;
lowering said control gate voltage signal after said subset of said set of non-volatile storage elements have reached said first level; and
subsequently programming said set of non-volatile memory storage elements with said slower rising control gate voltage signal until all or almost all non-volatile storage elements of said set of non-volatile storage elements reach one or more target levels.

11. A method according to claim 10, wherein:
said control gate voltage signal comprises a set of pulses.

12. A method according to claim 1, wherein:
said set of non-volatile storage elements corresponds to a page of data.

13. A method according to claim 1, wherein:
said set of non-volatile storage elements are NAND flash memory devices.

14. A method according to claim 1, wherein:
said set of non-volatile storage elements are multi-state flash memory devices.

15. A method according to claim 1, wherein:
said set of non-volatile storage elements are NAND multi-state flash memory devices.

16. A non-volatile storage system, comprising:
a set of non-volatile storage elements, said set of non-volatile storage elements are associated with units of data; and
one or more control circuits in communication with said set of non-volatile storage elements, said one or more control circuits determine which units of data to be programmed include at least a minimum number of fast programming non-volatile storage elements, said one or more control circuits program said units of data that do not include at least said minimum number of fast programming non-volatile storage elements with a faster rising control gate voltage signal and program said units of data that includes at least said minimum number of fast programming non-volatile storage elements with a slower rising control gate voltage signal, for a particular unit of data said minimum number of fast programming non-volatile storage elements is less than all non-volatile storage elements successfully being programmed.

17. A non-volatile storage system according to claim 16, wherein said programming said units of data that do not include said minimum number of fast programming non-volatile storage elements with a faster rising control gate voltage signal comprises:
programming with said faster rising control gate voltage signal until a subset of non-volatile storage elements has reached a first level and subsequently programming with said slower rising control gate voltage signal.

18. A non-volatile storage system according to claim 17, wherein subsequently programming with said slower rising control gate voltage signal comprises:

programming said non-volatile storage elements of said units of data that do not include said minimum number of fast programming non-volatile storage elements with a first bit line voltage until each of said non-volatile storage elements of said units of data that do not include said minimum number of fast programming non-volatile storage elements reaches one or more coarse verify levels, said non-volatile storage elements of said units of data that do not include said minimum number of fast programming non-volatile storage elements are multi-state memory devices; and programming said non-volatile storage elements of said units of data that do not include said minimum number of fast programming non-volatile storage elements with a second bit line voltage until each of said non-volatile storage elements of said units of data that do not include said minimum number of fast programming non-volatile storage elements reaches one or more target levels.

19. A non-volatile storage system according to claim 17, wherein said determining which units of data to be programmed include a minimum number of fast programming non-volatile storage elements comprises testing each unit of data separately by performing a method comprising:

applying a program pulse to a set non-volatile storage elements for a unit of data and determining whether at least one of said set of non-volatile memory elements has reached a predetermined programming level, said program pulse has a magnitude set low enough so that none of said set of non-volatile storage elements become over programmed from said program pulse.

20. A non-volatile storage system according to claim 16, wherein:

said minimum number of fast programming non-volatile storage elements is equal to one fast programming non-volatile storage element.

21. A non-volatile storage system according to claim 16, wherein programming said units of data that include at least said minimum number of fast programming non-volatile storage elements with a slower rising control gate voltage signal comprises:

initially lowering a magnitude of said control gate voltage.

22. A non-volatile storage system according to claim 21, wherein said programming said units of data that do not include said minimum number of fast programming non-volatile storage elements with a faster rising control gate voltage signal comprises:

continuing to raise said control gate voltage signal until a subset of non-volatile storage elements associated with a particular unit of data have reached a first level;

lowering said control gate voltage signal; and subsequently programming said non-volatile storage elements associated with said particular unit of data with said slower rising control gate voltage signal until said non-volatile storage elements associated with said particular unit of data reach one or more target levels.

23. A non-volatile storage system according to claim 16, wherein:

said control gate voltage signal comprises a set of pulses.

24. A non-volatile storage system according to claim 16, wherein:

said units of data correspond to pages of data.

25. A non-volatile storage system according to claim 16, wherein:

said set of non-volatile storage elements are NAND flash memory devices.

26. A non-volatile storage system according to claim 16, wherein:

said set of non-volatile storage elements are multi-state flash memory devices.

27. A non-volatile storage system according to claim 16, wherein:

said set of non-volatile storage elements are NAND multi-state flash memory devices.

28. A non-volatile storage system according to claim 16, wherein:

said one or more control circuits includes any one of or a combination of a command circuit, a state machine, a row control circuit, a column control circuit, a well control circuit, a source control circuit or a data I/O circuit.

29. A non-volatile storage system, comprising:

a set of non-volatile storage elements; and one or more control circuits in communication with said set of non-volatile storage elements, said one or more control circuits determine whether a set of non-volatile storage elements includes at least a minimum number of fast programming non-volatile storage elements, said one or more control circuits program said set of non-volatile storage elements using a first increment level for a word line program signal if said set of non-volatile storage elements does not include said minimum number of fast programming non-volatile storage elements, said one or more control circuits program said set of non-volatile storage elements using a second increment level for said word line program signal without using said first increment level for said word line program signal if said set of non-volatile storage elements includes said minimum number of fast programming non-volatile storage elements, said second increment signal is less than said first increment signal, said minimum number is less than all non-volatile storage elements being programmed for said set of non-volatile storage elements.

30. A non-volatile storage system according to claim 29, wherein:

if said set of non-volatile storage elements does not include said minimum number of fast programming non-volatile storage elements, said one or more control circuits program said set of non-volatile storage elements using said first increment level for said word line program signal until a subset of set of non-volatile storage elements has reached a first verify level and said one or more control circuits program said set of non-volatile storage elements using said second increment level for said word line program signal until all or almost all non-volatile storage elements of said set of non-volatile storage elements reach one or more target levels.

31. A non-volatile storage system according to claim 29, wherein said determining whether said set of non-volatile storage elements includes a minimum number of fast programming non-volatile storage elements comprises:

applying a program pulse to said set of non-volatile storage elements and determining whether at least one of said set of non-volatile storage elements reached a predetermined programming level.

32. A non-volatile storage system according to claim 29, wherein:

said minimum number of one or more fast programming non-volatile storage elements is equal to one fast programming non-volatile storage element.

33. A non-volatile storage system according to claim 29, wherein:
said set of non-volatile storage elements are NAND multi-state flash memory devices.

34. A method for programming non-volatile storage, comprising:
applying a program voltage signal to control gates for non-volatile storage elements;
if a minimum number of said non-volatile storage elements have been programmed to at least a first level, continuing to increase said program voltage signal by a smaller increment and applying said increased program voltage signal to said control gates for said non-volatile storage elements until said non-volatile storage elements have reached one or more target levels, said minimum number of said non-volatile storage elements is less than all non-volatile storage elements being programmed; and
if said minimum number of said non-volatile storage elements have not been programmed to at least said first level, continuing to increase said program voltage signal by a larger increment and applying said increased program voltage signal to said control gates for said non-volatile storage elements until said minimum number of said non-volatile storage elements have been programmed to at least said first level and then continuing to increase said program voltage signal by said smaller increment and applying said increased program voltage signal to said control gates for said non-volatile storage elements until all or almost all of said non-volatile storage elements have reached one or more target levels.

35. A method according to claim 34, wherein:
said continuing to increase said program voltage signal by said smaller increment and applying said increased program voltage signal to said control gates for said non-volatile storage elements until said non-volatile storage elements have reached one or more target levels comprises performing a coarse programming mode and a fine programming mode;
said coarse programming mode includes using a lower bit line voltage; and
said fine programming mode includes using a higher bit line voltage.

36. A method according to claim 34, wherein:
said continuing to increase said program voltage signal by said smaller increment includes applying a set of pulses having magnitudes that increase by said smaller increment; and
said continuing to increase said program voltage signal by said larger increment includes applying a set of pulses having magnitudes that increase by said larger increment.

37. A method according to claim 34, wherein:
said continuing to increase said program voltage signal by said smaller increment includes lowering said program voltage and subsequently raising said program voltage by said smaller increment.

38. A method according to claim 34, wherein:
said minimum number of said non-volatile storage elements is equal to one non-volatile storage element.

39. A method according to claim 34, wherein:
said set of non-volatile storage elements are multi-state flash memory devices.

40. A method for programming non-volatile storage, comprising:
applying a first program pulse to a set of non-volatile storage elements, said first program pulse has a magnitude set low enough so that none (or almost none) of said set of non-volatile storage elements become over programmed during said first program pulse;
determining whether said set of non-volatile storage elements include one or more fast programming non-volatile storage elements;
if said set of non-volatile storage elements include one or more fast programming non-volatile storage elements, programming said set of non-volatile storage elements by applying a first set of one or more program pulses to said set of non-volatile storage elements with said set of program pulses increasing in magnitude by a smaller increment; and
if said set of non-volatile storage elements do not include one or more fast programming non-volatile storage elements, programming said set of non-volatile storage elements by applying a second set of one or more program pulses to said set of non-volatile storage elements with said second set of program pulses increasing in magnitude by a larger increment.

41. A method according to claim 40, wherein:
said determining whether said set of non-volatile storage elements include one or more fast programming non-volatile storage elements includes determining whether any one of said set of non-volatile storage elements has reached a threshold for measuring fast programming non-volatile storage elements.

42. A method according to claim 41, wherein:
if said set of non-volatile storage elements do not include one or more fast programming non-volatile storage elements then, after applying said second set of one or more program pulses to said non-volatile storage elements, applying a third set of program pulses to said non-volatile storage elements; and
said third set of program pulses increase in magnitude by said smaller increment.

43. A method according to claim 42, wherein:
said set of non-volatile storage elements are multi-state flash memory devices.

44. A method according to claim 43, wherein:
said programming said set of non-volatile storage elements by applying a first set of one or more program pulses to said set of non-volatile storage elements includes performing a coarse programming mode and a fine programming mode.

* * * * *